United States Patent
Miyauchi et al.

(10) Patent No.: US 12,429,523 B2
(45) Date of Patent: Sep. 30, 2025

(54) ABNORMALITY DIAGNOSIS DEVICE AND ABNORMALITY DIAGNOSIS METHOD

(71) Applicant: Mitsubishi Electric Corporation, Tokyo (JP)

(72) Inventors: Toshihiko Miyauchi, Tokyo (JP); Makoto Kanemaru, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 185 days.

(21) Appl. No.: 18/264,771

(22) PCT Filed: Apr. 22, 2021

(86) PCT No.: PCT/JP2021/016243
§ 371 (c)(1),
(2) Date: Aug. 9, 2023

(87) PCT Pub. No.: WO2022/224391
PCT Pub. Date: Oct. 27, 2022

(65) Prior Publication Data
US 2024/0302435 A1   Sep. 12, 2024

(51) Int. Cl.
*G01R 23/16*     (2006.01)
*G01R 31/34*     (2020.01)

(52) U.S. Cl.
CPC ........... *G01R 31/343* (2013.01); *G01R 23/16* (2013.01)

(58) Field of Classification Search
CPC ............................ G01R 23/16; G01R 31/343
See application file for complete search history.

(56) References Cited

U.S. PATENT DOCUMENTS

2020/0284690 A1*   9/2020   Kanemaru .......... G01M 13/023

FOREIGN PATENT DOCUMENTS

EP       3648338 A1      5/2020
JP       2017-181437 A   10/2017
(Continued)

OTHER PUBLICATIONS

International Search Report (PCT/ISA/210) with translation and Written Opinion (PCT/ISA/237) mailed on Jun. 22, 2021 by the Japanese Patent Office as the International Searching Authority for International Application No. PCT/JP2021/016243. (11 pages).
(Continued)

*Primary Examiner* — Alesa Allgood
(74) *Attorney, Agent, or Firm* — BUCHANAN, INGERSOLL & ROONEY PC

(57) ABSTRACT

An abnormality diagnosis device performs determination for at least one of abnormality of an electric motor driven by an inverter driven at a predetermined operation frequency and abnormality of a motive power transmission mechanism which transmits motive power from the electric motor to a load, wherein spectrum peaks extracted through FFT analysis of detected current of the electric motor are analyzed, and frequencies of spectrum peaks due to noise of the inverter are acquired in advance using the operation frequency and the frequencies of sideband waves with respect to the operation frequency. In abnormality diagnosis, abnormality determination is performed after spectrum peaks due to noise of the inverter are extracted from spectrum peaks extracted through FFT analysis of detected current of the electric motor.

13 Claims, 19 Drawing Sheets

(56) References Cited

FOREIGN PATENT DOCUMENTS

| | | |
|---|---|---|
| JP | 6410572 B2 | 10/2018 |
| JP | 6628905 B2 | 1/2020 |
| JP | 6824494 B1 | 2/2021 |
| KR | 10-2019-0118339 A | 10/2019 |
| KR | 10-2020-0010449 A | 1/2020 |

OTHER PUBLICATIONS

Korean Office Action dated Jan. 21, 2025, issued in the corresponding Korean Patent Application No. 10-2023-7034585, 14 pages including 8 pages of English Translation.

* cited by examiner

ABNORMALITY DIAGNOSIS DEVICE AND ABNORMALITY DIAGNOSIS METHOD

TECHNICAL FIELD

The present disclosure relates to an abnormality diagnosis device and an abnormality diagnosis method.

BACKGROUND ART

At a plant, there is a lot of mechanical equipment connected to an electric motor via a motive power transmission mechanism, and abnormality diagnosis of an electric motor and a motive power transmission mechanism is performed for maintenance.

In Patent Document 1, the applicant discloses technology that can detect abnormality occurring in a motive power transmission mechanism connected to an electric motor, at an early stage, easily, and at low cost, using a current detector, without using a special sensor or the like.

In addition, it is known that, in an electric motor driven by a commercial power supply, frequency analysis is performed on measured current and abnormality diagnosis of the electric motor can be performed on the basis of the spectrum intensities of sideband waves due to abnormality that occurs at frequencies near a power supply frequency (see, for example, Patent Document 2).

CITATION LIST

Patent Document

Patent Document 1: Japanese Patent No. 6628905
Patent Document 2: Japanese Patent No. 6410572

SUMMARY OF THE INVENTION

Problems to be Solved by the Invention

In recent years, an electric motor with an inverter provided for drive control has been increasingly used. In a case of performing abnormality diagnosis using a spectrum peak of current flowing through the electric motor, there is a possibility that a spectrum peak due to an inverter, a spectrum peak due to a motive power transmission mechanism, and a spectrum peak due to electric motor abnormality are superimposed on each other. If these spectrum peaks overlap each other, there is a possibility that accurate determination cannot be performed in abnormality diagnosis in the conventional Patent Documents 1 and 2.

The present disclosure has been made to solve the above problem, and an object of the present disclosure is to provide an abnormality diagnosis device and an abnormality diagnosis method in which, in a case of using an inverter for drive control of an electric motor, a spectrum peak due to the inverter is extracted, so that there is no possibility of erroneous determination.

Solution to the Problems

An abnormality diagnosis device according to the present disclosure is an abnormality diagnosis device which performs determination for at least one of abnormality of an electric motor driven by power converted by an electric motor control device and abnormality of a motive power transmission mechanism which transmits motive power from the electric motor to a load, the electric motor control device including an inverter, the abnormality diagnosis device including: a current detection circuit for detecting current of the electric motor; and a monitoring diagnosis unit which performs abnormality determination using spectrum peaks extracted by performing FFT analysis of current detected by the current detection circuit. The monitoring diagnosis unit includes: a peak analysis unit which performs analysis using an operation frequency of the electric motor control device for driving the inverter and frequencies of sideband waves with respect to the operation frequency, and estimates whether or not the extracted spectrum peak is due to noise of the inverter; an inverter noise frequency determination unit which determines a frequency of the spectrum peak due to noise of the inverter on the basis of the spectrum peak estimated to be due to noise of the inverter by the peak analysis unit; an inverter noise frequency storage unit which stores in advance the frequency of the spectrum peak due to noise of the inverter determined by the inverter noise frequency determination unit; and an abnormality determination unit. The abnormality determination unit performs abnormality determination, after extracting the spectrum peak due to noise of the inverter, from the spectrum peaks extracted through FFT analysis of the current detected by the current detection circuit.

Effect of the Invention

The abnormality diagnosis device and the abnormality diagnosis method of the present disclosure make it possible to provide an abnormality diagnosis device and an abnormality diagnosis method in which, in a case of using an inverter for drive control of an electric motor, a spectrum peak due to noise of the inverter is extracted, so that there is no possibility of erroneous determination.

DESCRIPTION OF EMBODIMENTS

Figure 1:
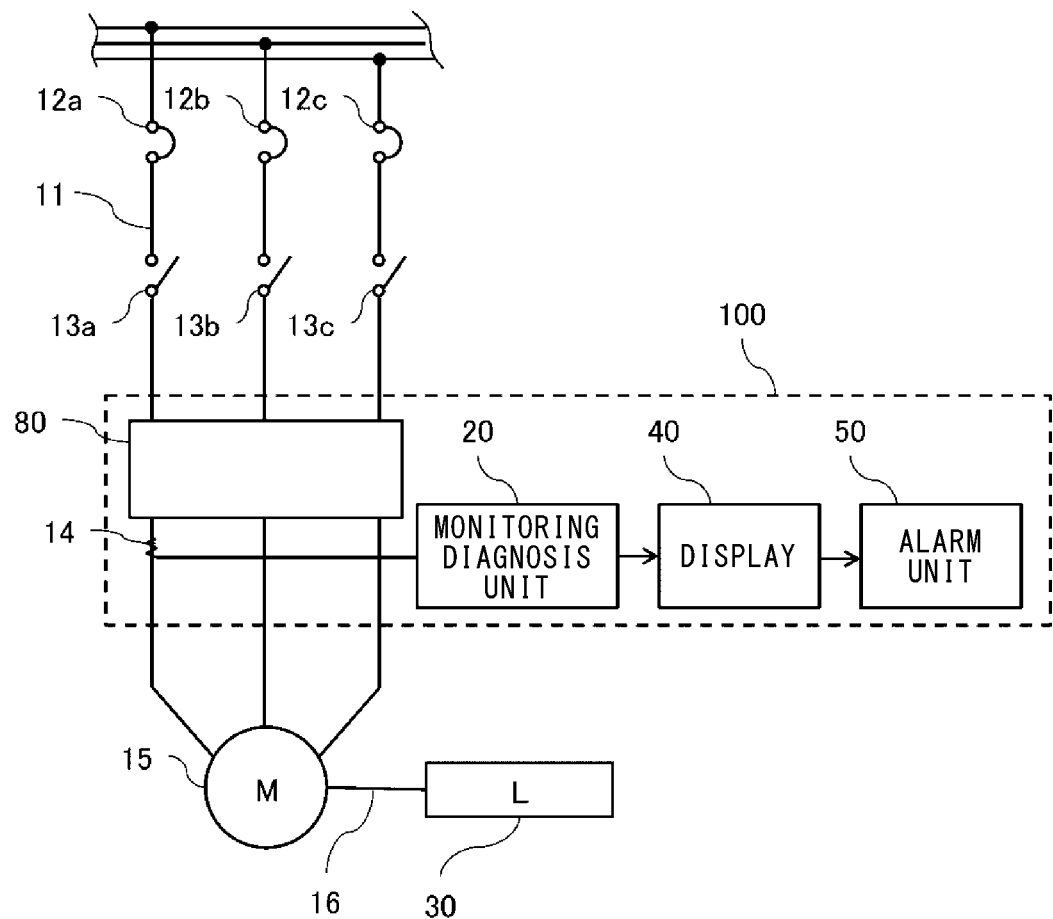
FIG. 1 illustrates the schematic configuration of an abnormality diagnosis device according to embodiment 1.

Hereinafter, embodiments will be described with reference to the drawings. In the drawings, the same reference characters denote the same or corresponding parts.

Embodiment 1

Hereinafter, a diagnosis device for an electric motor according to embodiment 1 will be described with reference to the drawings.

FIG. 1 illustrates the schematic configuration of the abnormality diagnosis device according to embodiment 1. Normally, an abnormality diagnosis device 100 detects abnormality of an electric motor 15 and abnormality of a motive power transmission mechanism 16 which transmits motive power from the electric motor 15 to mechanical equipment 30 as a load, and performs abnormality diagnosis. In embodiment 1, as described later, an example in which abnormality of the motive power transmission mechanism 16 is detected and abnormality diagnosis is performed, will be shown. In the drawings, the electric motor 15 is an example of many electric motors used in a plant or the like, and is connected to power supply lines 11 for electric motor driving via an electric motor control device 80. Circuit breakers 12a, 12b, 12c and electromagnetic contactors 13a, 13b, 13c are connected on the power supply lines 11 for respective phases.

The abnormality diagnosis device 100 includes the electric motor control device 80, a monitoring diagnosis unit 20, a display 40, an alarm unit 50, and a current detector 14 connected to any of the three-phase power supply lines 11 connected to the electric motor 15. The abnormality diagnosis device 100 may be provided in a motor control center for managing many electric motors provided in the plant or the like, or may be a motor diagnosis device provided separately from the motor control center, for example. The electric motor control device 80 may be included in the abnormality diagnosis device 100 or may be provided independently of the abnormality diagnosis device 100.

The current detector 14 may be provided for each phase of the three-phase power supply lines 11. However, measurement may be performed for any of the phases. The position where the current detector 14 is provided is not limited as long as drive current of the electric motor 15 can be measured. This means that detection accuracy does not change depending on the measurement position.

In the present embodiment, one monitoring diagnosis unit 20 is provided for one electric motor 15.

The display 40 displays a diagnosis result of the monitoring diagnosis unit 20. The alarm unit 50 outputs an alarm by sound or visually on the basis of the diagnosis result of the monitoring diagnosis unit 20, to perform notification of abnormality of the electric motor and the motive power transmission mechanism.

Figure 2:
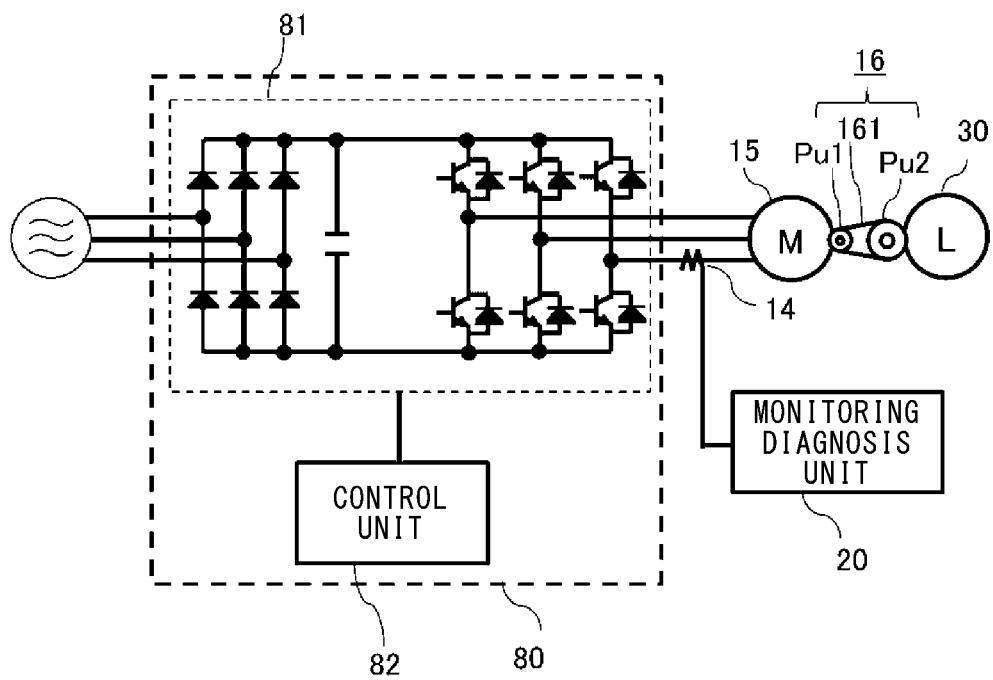
FIG. 2 shows an example of the configuration of an electric motor control device according to embodiment 1.

FIG. 2 illustrates the configuration of the electric motor control device 80. The electric motor control device 80 includes an inverter (power conversion device) 81 and a control unit 82 for driving the inverter 81. For example, in a case where the inverter 81 is formed of semiconductor switching elements, the semiconductor switching elements of the inverter 81 are drive-controlled so as to perform power conversion by a pulse width modulation (PWM) method or the like using a carrier wave and a rectangular wave generated by the control unit 82. Here, the frequency of the carrier wave as a fundamental frequency for driving the inverter 81 is an operation frequency $f_s$ of the electric motor control device 80. The power converted by the inverter 81 is supplied to the electric motor 15. That is, the electric motor 15 is drive-controlled by the inverter 81.

The motive power transmission mechanism 16 is formed by a pulley Pu1 connected to a rotary shaft of the electric motor 15, a pulley Pu2 connected to a drive shaft of the mechanical equipment 30, and, for example, a belt 161 which is a motive power transmission member and is wound around the pulleys. The motive power transmission member is not limited to a belt, and may be a speed reduction device, a chain, or the like.

<Configuration of Monitoring Diagnosis Unit 20>

Figure 3:
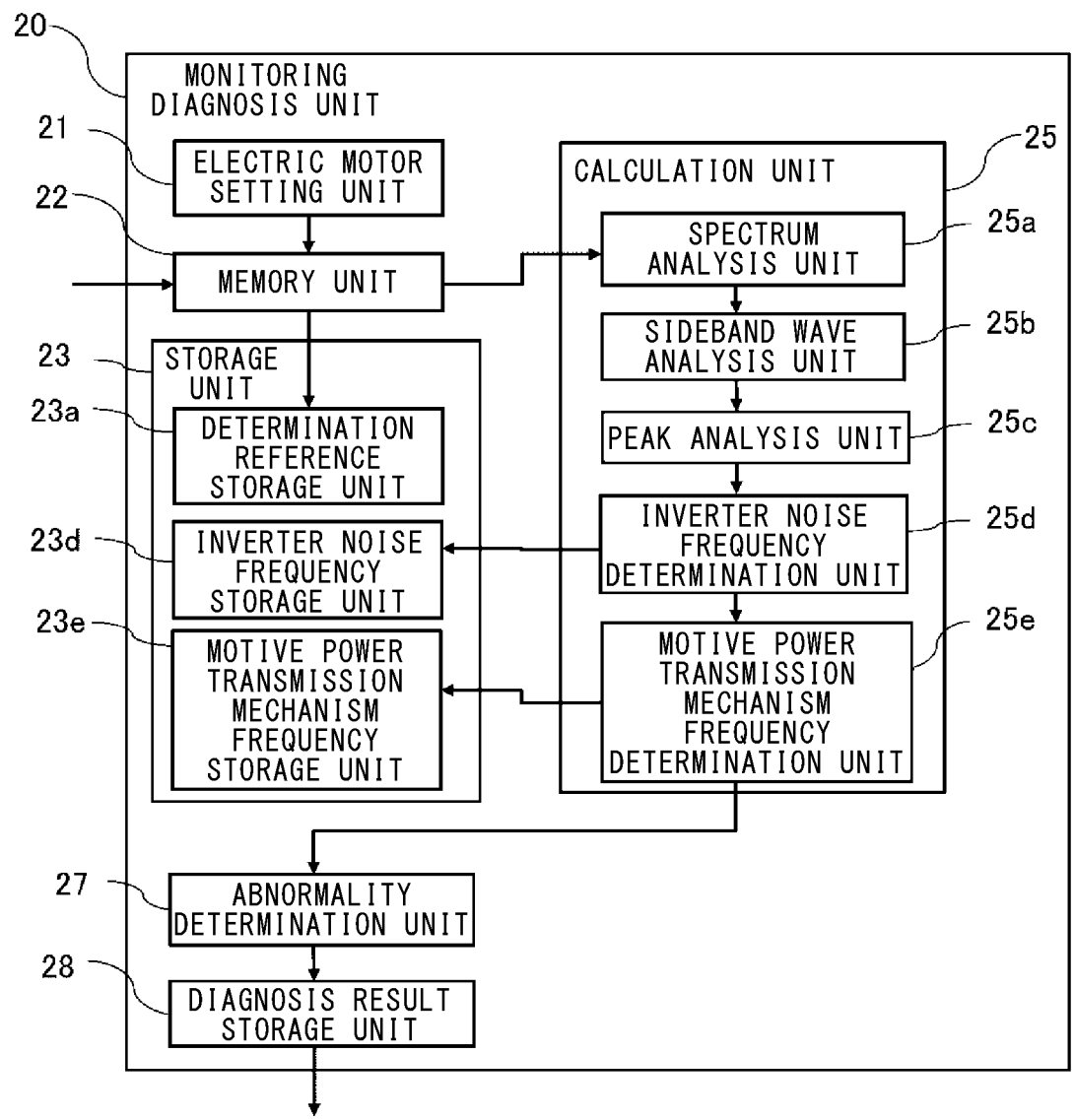
FIG. 3 is a block diagram showing the configuration of a monitoring diagnosis unit according to embodiment 1.

Next, the configuration of the monitoring diagnosis unit 20 will be described. FIG. 3 is a block diagram showing the configuration of the monitoring diagnosis unit 20 of the abnormality diagnosis device 100 according to embodiment 1. In FIG. 3, the monitoring diagnosis unit 20 includes an electric motor setting unit 21, a memory unit 22, a storage unit 23, a calculation unit 25, an abnormality determination unit 27, and a diagnosis result storage unit 28.

In the abnormality diagnosis device 100 according to embodiment 1, a configuration example of the monitoring diagnosis unit 20 for detecting abnormality of the motive power transmission mechanism 16 will be described.

The electric motor setting unit 21 is used for setting information of the motive power transmission mechanism 16 and information of the electric motor 15. In a case where the motive power transmission mechanism 16 is a belt, setting is performed so as to recognize that the belt is attached. In a case where the motive power transmission mechanism 16 is a speed reduction device, setting is performed so as to recognize that the speed reduction device is attached. In a case where the motive power transmission mechanism 16 is absent, setting is performed so as to recognize the absence.

In addition, the electric motor setting unit 21 is used for acquiring specifications of the electric motor 15 such as the power supply frequency, the number of poles, and the rated rotational speed from information of a rating plate attached to the electric motor 15. The rotational frequency of the electric motor 15 under no load can be calculated as $2 \cdot f_s/p$ ($f_s$: the operation frequency of the electric motor control device, p: the number of poles). Therefore, a rotational frequency $f_r$ of the electric motor 15 is always a value between the rotational frequency under no load and the rotational frequency in the rated operation, and thus the range of the rotational frequency is limited. Using such information, the rotational frequency of the electric motor is identified with high accuracy online and in real time, and is used for machinery abnormality detection for the electric motor.

The specifications information of the electric motor 15 and the information of the motive power transmission mechanism as described above are stored in the memory unit 22. In addition, drive current of the electric motor 15 acquired by the current detector 14 is stored in the memory unit 22.

The storage unit 23 includes a determination reference storage unit 23*a*, an inverter noise frequency storage unit 23*d*, and a motive power transmission mechanism frequency storage unit 23*e*.

The determination reference storage unit 23*a* is used for storing a threshold or the like for determining abnormality of the motive power transmission mechanism 16.

The inverter noise frequency storage unit 23*d* stores the value of the frequency of a spectrum peak due to noise of the inverter caused from the electric motor control device 80. It is desirable to store not only the value of the frequency but also the signal intensity of the spectrum peak due to noise of the inverter, the operation frequency of the electric motor control device 80, and the signal intensity of the spectrum peak for the operation frequency in the same manner. For these values, results obtained through analysis by the calculation unit 25 described later are stored. Alternatively, if a caused frequency is found in advance, the values may be acquired and set by the electric motor setting unit 21.

The motive power transmission mechanism frequency storage unit 23*e* stores the value of the frequency of a spectrum peak due to the motive power transmission mechanism. It is preferable to store not only the value of the frequency but also the signal intensity of the spectrum peak due to the motive power transmission mechanism, the operation frequency of the electric motor control device 80 when the spectrum peak due to the motive power transmission mechanism is acquired, and the signal intensity of the spectrum peak for the operation frequency in the same manner.

The calculation unit 25 includes a spectrum analysis unit 25*a*, a sideband wave analysis unit 25*b*, a peak analysis unit 25*c*, an inverter noise frequency determination unit 25*d*, and a motive power transmission mechanism frequency determination unit 25*e*.

The spectrum analysis unit 25*a* executes current fast Fourier transform (FFT) analysis (frequency analysis) using current detected by the current detector 14.

The sideband wave analysis unit 25*b* detects all spectrum peaks from a spectrum waveform analyzed by the spectrum analysis unit 25*a*. Preferably, the detected frequency range is 0 to 1000 Hz. Next, spectrum peaks that satisfy a condition of sideband waves are determined among the detected spectrum peaks.

The peak analysis unit 25*c* analyzes sideband waves extracted by the sideband wave analysis unit 25*b* on a frequency basis.

The inverter noise frequency determination unit 25*d* determines whether or not sideband waves are spectrum peaks due to noise of the inverter, on the basis of the result of analysis by the peak analysis unit 25*c*. If the sideband waves are determined to be frequencies due to noise of the inverter, the values of the frequencies of the spectrum peaks are stored in the inverter noise frequency storage unit 23*d* of the storage unit 23. At the same time, it is preferable to also store the signal intensities of the spectrum peaks, the operation frequency of the electric motor control device 80 when the spectrum peaks due to noise of the inverter are acquired, and the signal intensity of the spectrum peak for the operation frequency in the same manner.

The motive power transmission mechanism frequency determination unit 25*e* determines whether or not sideband waves are spectrum peaks due to the motive power transmission mechanism, on the basis of the result of analysis by the peak analysis unit 25*c*. If the sideband waves are determined to be spectrum peaks due to the motive power transmission mechanism, the values of the frequencies of the spectrum peaks are stored in the motive power transmission mechanism frequency storage unit 23*e*. At the same time, it is preferable to also store the signal intensities of the spectrum peaks, the operation frequency of the electric motor control device 80 when the spectrum peaks due to the motive power transmission mechanism are acquired, and the signal intensity of the spectrum peak for the operation frequency in the same manner.

The abnormality determination unit 27 determines whether or not there is abnormality of the motive power transmission mechanism 16. Using a threshold stored in advance in the determination reference storage unit 23*a*, comparison is performed with the spectrum peaks determined by the motive power transmission mechanism frequency determination unit 25*e*, to perform abnormality determination.

The diagnosis result storage unit 28 stores the result of determination by the abnormality determination unit 27.

<Analysis of Spectrum Peaks in Calculation Unit 25>

Next, an analysis method for spectrum peaks in the calculation unit 25 will be described.

Figure 4:
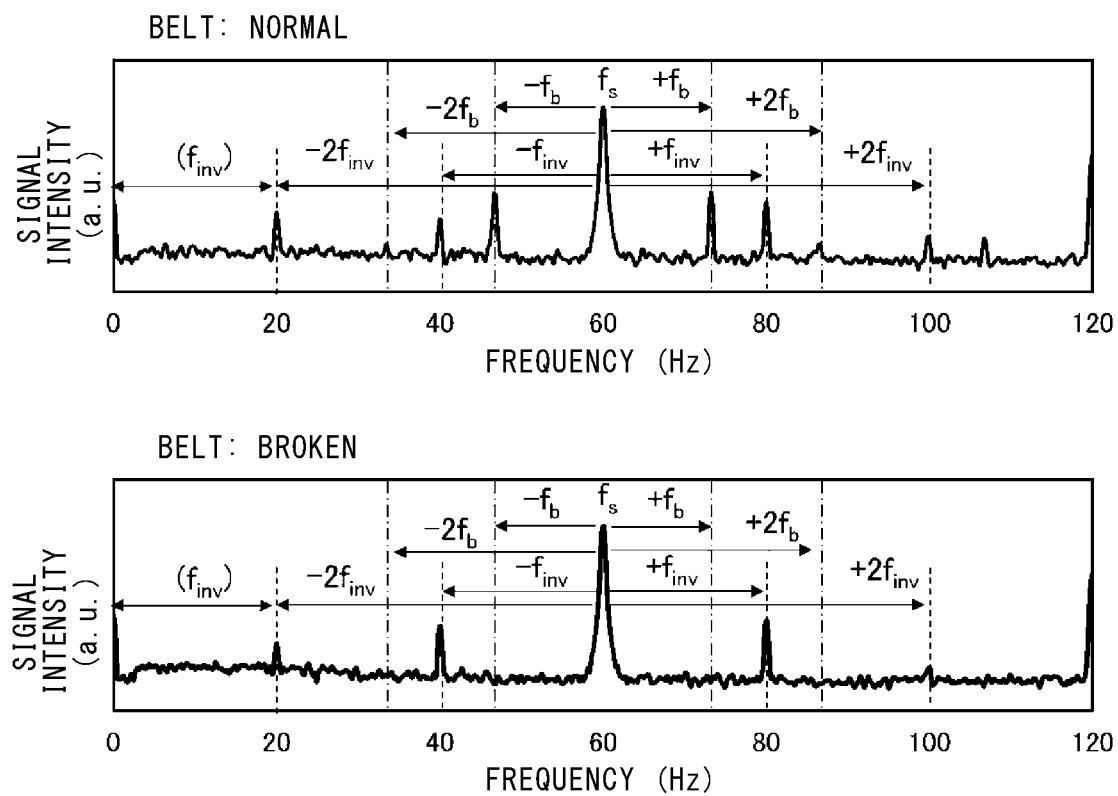
FIG. 4 shows spectrum waveforms which are examples of analysis results by current FFT using the abnormality diagnosis device according to embodiment 1.

FIG. 4 shows spectrum waveforms of current FFT analysis results. The upper graph shows a case where the belt 161 of the motive power transmission mechanism 16 is normal, and the lower graph shows a case where the belt 161 is broken.

In the spectrum waveforms shown in FIG. 4, spectrum peaks P appear at equal intervals on both of the high-frequency side and the low-frequency side with respect to the operation frequency $f_s$ (here, 60 Hz) of the electric motor control device 80. That is, the spectrum peaks P appear at intervals of $+f_b$, $+2f_b$, etc., on the high-frequency side and $-f_b$, $-2f_b$, etc., on the low-frequency side from the power supply frequency. These spectrum peaks P are spectrum peaks of sideband waves. The signal intensities and appearance patterns of the spectrum peaks P vary by the rotational speed of the electric motor 15.

First, the reason why the spectrum peaks P appear will be described. For example, since the belt 161 is connected to the pulley Pu1 connected to the rotary shaft of the electric motor 15, speed variation of the belt 161 causes variation in the rotational speed of a rotor of the electric motor 15, which influences drive current of the electric motor 15. At this time, speed variation occurs at a frequency at which the belt 161 makes one revolution, so that spectrum peaks P for the frequency at which the belt 161 makes one revolution and harmonics thereof, appear. The frequency band $f_b$ where the spectrum peak P appears is represented by the following Expression (1):

$$f_b = (2\Pi D_r \cdot f_r)/L \qquad \text{Expression (1)}$$

where $D_r$ is the radius of the pulley Pu1 connected to the rotary shaft of the electric motor 15, $f_r$ is the rotational frequency of the rotary shaft of the electric motor 15, and L is the length of the belt 161.

Thus, the frequency band $f_b$ is determined by the radius $D_r$ of the pulley Pu1, the rotational frequency $f_r$ of the rotary shaft of the electric motor 15, and the length L of the belt 161. Then, when the current waveform is subjected to frequency analysis by FFT, sideband waves appear at $f_s \pm f_b$ on both sides of the operation frequency $f_s$. At the same time, harmonic components $f_s \pm 2f_b$ of the sideband waves are observed. Depending on the operation condition of the electric motor 15, further harmonics such as $f_s \pm 3f_b$ are also observed.

Next, an analysis method for the sideband waves acquired by the sideband wave analysis unit 25b, in the peak analysis unit 25c, will be described. Here, the value of the frequency of the sideband wave acquired by the sideband wave analysis unit 25b, i.e., the frequency which corresponds to a shift from the operation frequency $f_s$ and at which the sideband wave appears, is denoted by $f_p$, and calculation of the following Expression (2) is performed.

$$\Delta = f_s/f_p \qquad \text{Expression (2)}$$

If the calculated value of $\Delta$ is an integer, it is determined (estimated) that the spectrum peak is highly likely to be due to noise of the inverter. On the other hand, if $\Delta$ is not an integer, it is determined (estimated) that the spectrum peak might be a spectrum peak of a sideband wave due to the motive power transmission mechanism.

Here, the reason why it can be determined that the spectrum peak is highly likely to be due to inverter noise if $\Delta$ is an integer will be described.

In the inverter 81 provided to the electric motor control device 80, the frequency of a carrier wave for determining a timing of switching of the switching element in DC-AC conversion is defined as an operation frequency $f_s$, a sampling frequency for determining a timing of temporarily storing the value of a modulation wave for comparison with the carrier wave is defined as $f_{sm}$, and the frequency of the modulation wave is defined as $f_0$. At this time, in a case where the frequency $f_s$ of the carrier wave or the sampling frequency $f_{sm}$ is not a multiple of the modulation wave frequency $f_0$, noise having spectrum peaks at the greatest common divisor of the above frequencies and at multiples thereof, occurs. Thus, spectrum peaks of the inverter noise occur for the greatest common divisor of the operation frequency $f_s$ or the sampling frequency $f_{sm}$ and the modulation wave frequency $f_0$, and harmonics thereof. That is, the operation frequency $f_s$ of the electric motor control device is divisible by a frequency $f_{inv}$ of a caused spectrum peak due to inverter noise, so that $\Delta$ in Expression (2) is an integer.

In the spectrum waveforms shown in FIG. 4, spectrum peaks due to inverter noise appear at $f_s \pm f_{inv}$ and $f_s \pm 2f_{inv}$ on both sides of the operation frequency $f_s$ (here, 60 Hz) of the electric motor control device 80, and $f_{inv}$ is 20 (Hz). Therefore, in Expression (2), $\Delta$ is 60/20=3 and thus is an integer.

Next, the frequency $f_b$ of a series of spectrum peaks due to the motive power transmission mechanism will be described.

The frequency $f_b$ is calculated by Expression (1). Here, the rotational frequency $f_r$ of the rotary shaft of the electric motor 15 is calculated by the following Expression (3).

$$f_r = (2f_s \cdot (1-s))/p \qquad \text{Expression (3)}$$

Accordingly, Expression (2) is calculated for the frequency of the series of spectrum peaks due to the motive power transmission mechanism, thus being represented by the following Expression (4).

$$\begin{aligned}\Delta &= f_s/f_p = f_s/f_b \qquad \text{Expression (4)}\\ &= f_s/((2\Pi D_r \cdot f_r)/L)\\ &= pL/(4\Pi D_r \cdot (1-s))\end{aligned}$$

In Expression (4), the denominator includes $\pi$ (the ratio of the circumference of a circle to its diameter) which is an irrational number, and therefore $\Delta$ is not an integer, theoretically.

Also in the spectrum waveform shown in FIG. 4, it is found that $\Delta = f_s/f_p = f_s/f_b$ is not an integer.

As described above, it is found that, in the peak analysis unit 25c, whether the spectrum peak is a spectrum peak due to inverter noise or a spectrum peak due to the motive power transmission mechanism can be determined through calculation of Expression (2).

Next, the details of operation of the inverter noise frequency determination unit 25d will be described. For the spectrum peaks for which the calculated value of $\Delta$ is an integer and thus it is determined that the spectrum peaks are highly likely to be due to inverter noise (it is estimated that the spectrum peaks are due to inverter noise) in the peak analysis unit 25c, the inverter noise frequency determination unit 25d determines whether or not the spectrum peaks form a series of spectrum peaks. The series of spectrum peaks is spectrum peaks occurring at frequencies at equal intervals. As a condition, these spectrum peaks need to be sideband waves. If the spectrum peaks are determined to be a series of spectrum peaks, the values of the frequencies of the spectrum peaks are stored in the inverter noise frequency storage unit 23d of the storage unit 23. As described above, it is preferable to also store the signal intensities of the spectrum peaks, the operation frequency of the electric motor control device 80, and the signal intensity of the spectrum peak for the operation frequency, at the same time.

Next, the details of operation of the motive power transmission mechanism frequency determination unit 25e will be described. For the spectrum peaks for which $\Delta$ is not an integer and thus it is determined that the spectrum peaks are highly likely to be due to the motive power transmission mechanism in the peak analysis unit 25c, the motive power transmission mechanism frequency determination unit 25e determines whether or not a difference intensity from the signal intensity of the spectrum peak for the operation frequency $f_s$ of the electric motor control device 80 is a constant A (dB) or less. Preferably, the constant A is about 50 (dB) or 60 (dB). That is, each spectrum peak due to the motive power transmission mechanism has a greater signal intensity than spectrum peaks therearound. If the difference intensity is the constant A (dB) or less, whether or not the spectrum peaks form a series of two or more spectrum peaks is determined. If it is determined that the spectrum peaks form a series of two or more spectrum peaks, the values of the frequencies of the spectrum peaks are stored in the motive power transmission mechanism frequency storage unit 23e. As described above, it is preferable to also store the signal intensities of the spectrum peaks, the operation frequency of the electric motor control device 80, and the signal intensity of the spectrum peak for the operation frequency, at the same time.

The abnormality determination unit 27 determines whether or not there is abnormality of the motive power transmission mechanism 16. For the series of spectrum peaks due to the motive power transmission mechanism determined by the motive power transmission mechanism frequency determination unit 25e, comparison is performed with a threshold B (dB) stored in advance in the determination reference storage unit 23a, to determine belt breakage.

If D or more spectrum peaks whose signal intensities exceed a threshold C (dB) stored in advance in the determination reference storage unit 23a are detected, it is determined that there is abnormality. The number D of spectrum peaks used in abnormality determination is, for example, 2, and is not limited to 2. Desirably, the number D is not less than 2.

The threshold used in abnormality determination may be stored in advance in the determination reference storage unit 23a, or data when the motive power transmission mechanism is normal may be stored in the memory unit 22 and statistical processing or the like may be performed thereon, to determine the threshold.

As a method for determining the threshold using statistical processing, for example, learning is performed for a certain period, to calculate a dispersion σ of difference intensities between the signal intensities of spectrum peaks due to the motive power transmission mechanism and the signal intensity of the spectrum peak for the operation frequency $f_s$ of the electric motor control device 80 in a normal case, and then the threshold is set at 3σ. In this case, it is determined that there is abnormality (belt has broken), when the value is outside of a range of ±3σ.

The threshold value may be determined by a method using machine learning, instead of statistical processing. The behavior of data may be learned from normal data of motor equipment of the same type in advance, and the threshold may be determined on the basis of the learned data.

Alternatively, patterns of various data of a plurality of electric motors may be learned, various patterns may be classified, and the threshold or the like may be determined from the classified patterns.

<Abnormality Diagnosis Procedure 1 for Motive Power Transmission Mechanism 16: Initial Learning>

Next, an abnormality diagnosis method according to the present embodiment 1 will be described with reference to the drawings.

Figure 5A:
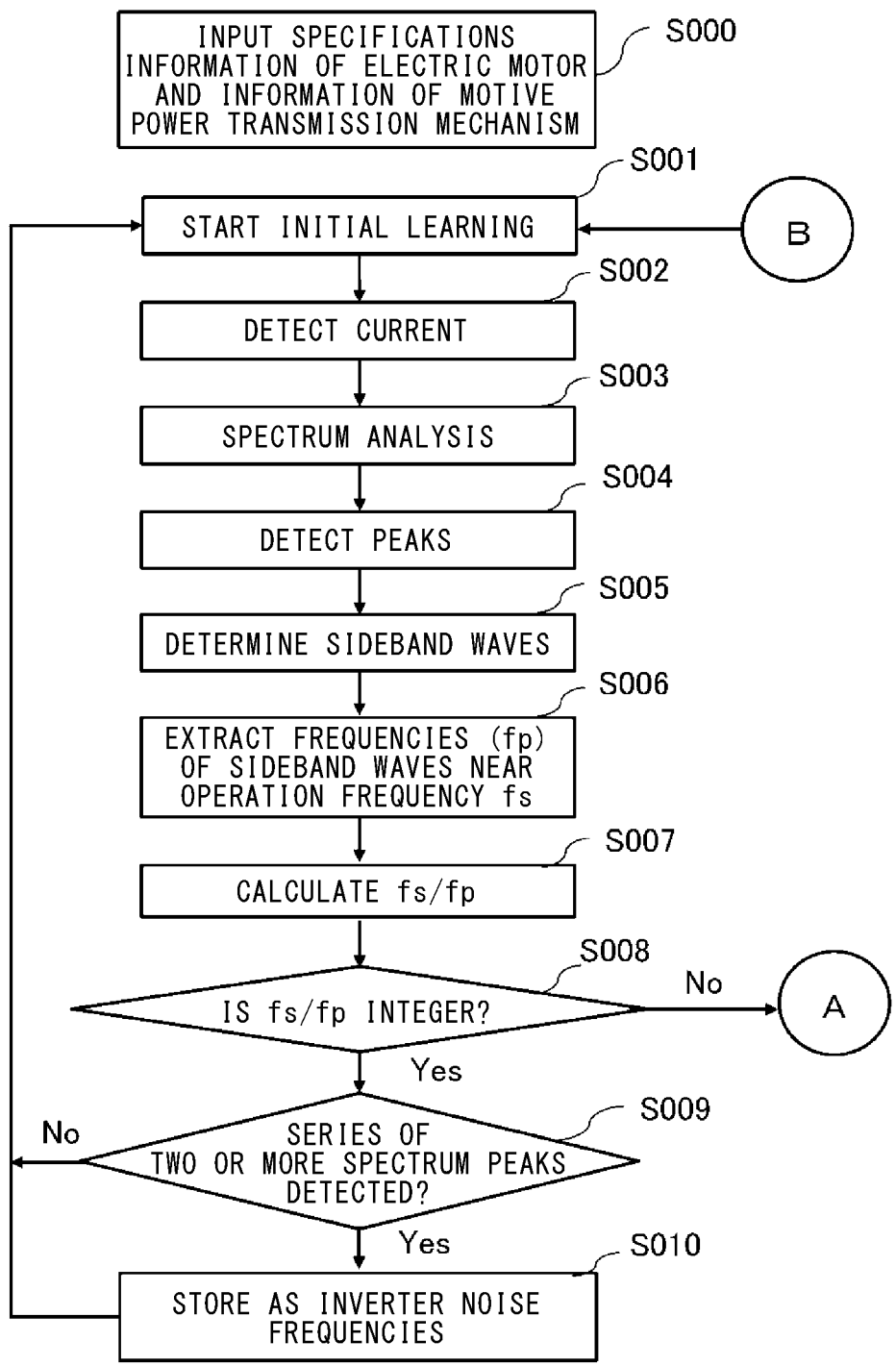
FIG. 5A is a flowchart showing the entire procedure for performing abnormality diagnosis of a motive power transmission mechanism using the abnormality diagnosis device according to embodiment 1.
Figure 5B:
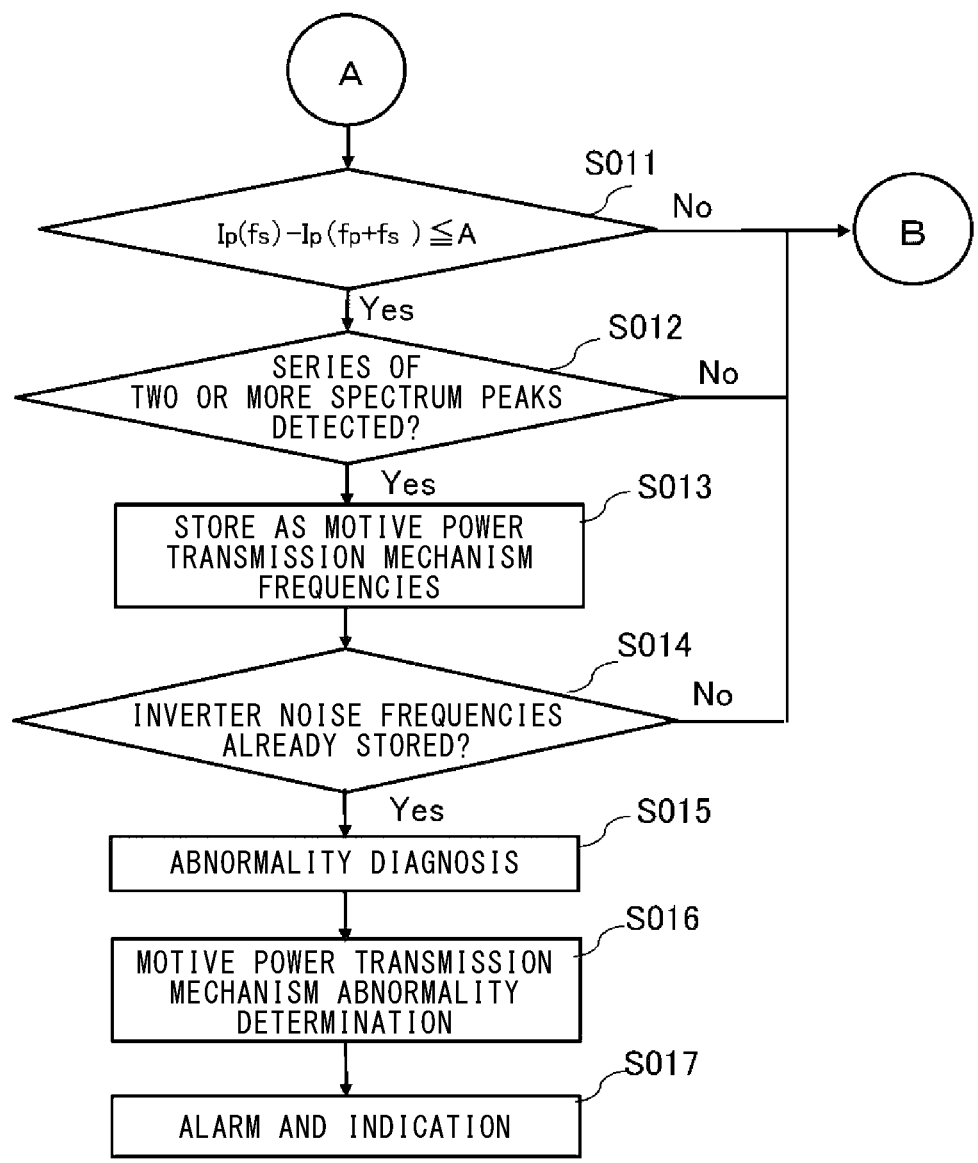
FIG. 5B is a flowchart showing the entire procedure for performing abnormality diagnosis of the motive power transmission mechanism using the abnormality diagnosis device according to embodiment 1.

FIG. 5A and FIG. 5B are flowcharts showing the procedure for diagnosing abnormality of the motive power transmission mechanism according to embodiment 1.

First, in step S000, specifications information of the electric motor and information of the motive power transmission mechanism are inputted to the electric motor setting unit 21.

Next, in step S001, initial learning is started.

In step S002, current flowing through the electric motor 15 is detected by the current detector 14.

In step S003, the detected current is subjected to current FFT analysis by the spectrum analysis unit 25a, to acquire a spectrum waveform.

In step S004, the sideband wave analysis unit 25b detects all spectrum peaks from the spectrum waveform, and determines that spectrum peaks satisfying a condition of sideband waves are sideband waves, among the detected spectrum peaks (step S005).

In step S006, frequencies of sideband waves near the operation frequency $f_s$ of the electric motor control device 80 are extracted. At this time, it is preferable that, among the spectrum peaks determined to be sideband waves by the sideband wave analysis unit 25b, the frequency $f_p$ of the sideband wave is extracted in order from the spectrum peak near the operation frequency. There are a plurality of frequencies $f_p$.

In step S007, the peak analysis unit 25c calculates a value $f_s/f_p$ obtained by dividing the operation frequency $f_s$ by the frequency $f_p$ of the sideband wave.

In step S008, if the calculated value of $f_s/f_p$ is an integer (Yes in step S008), the spectrum peak is estimated to be due to inverter noise, and the process proceeds to step S009, in which the inverter noise frequency determination unit 25d determines whether or not a series of two or more spectrum peaks is detected.

In step S009, if it is determined that a series of two or more spectrum peaks is not detected (No in step S009), the process returns to step S001.

In step S009, if it is determined that a series of two or more spectrum peaks is detected (Yes in step S009), the process proceeds to step S010, and the frequency and the like of the spectrum peak having the frequency $f_{inv}$ are stored as an inverter noise frequency in the inverter noise frequency storage unit 23d.

In step S008, if the calculated value of $f_s/f_p$ is not an integer (No in step S008), the process proceeds to step S011, in which the motive power transmission mechanism frequency determination unit 25e calculates a difference intensity between a signal intensity $I_p(f_s)$ of the spectrum peak for the operation frequency $f_s$ and a signal intensity $I_p(f_s \pm f_p)$ of the spectrum peak for the sideband wave frequency $f_p$, and determines whether or not the difference intensity is the constant A (dB) or less.

In step S011, if $I_p(f_s)-I_p(f_s \pm f_p) \leq A$ is satisfied (Yes in step S011), the process proceeds to step S012, to determine whether or not a series of two or more spectrum peaks is detected.

In step S012, if it is determined that a series of two or more spectrum peaks is detected (Yes in step S012), the process proceeds to step S013, in which the frequency and the like of the spectrum peak having the frequency $f_b$ are stored as a motive power transmission mechanism frequency in the motive power transmission mechanism frequency storage unit 23e.

Next, in step S014, if it is determined that inverter noise frequencies have already been stored in the inverter noise frequency storage unit 23d, the initial learning is finished because inverter noise frequencies and motive power transmission mechanism frequencies have already been acquired. In general, there are a plurality of frequencies $f_b$ of sideband waves of spectrum peaks due to the motive power transmission mechanism, and therefore it is desirable to acquire a plurality of pairs of motive power transmission mechanism frequencies by repeating steps S011 to S013.

If $I_p(f_s)-I_p(f_s\pm f_p)>A$ is satisfied (No in step S011) in step S011, and if it is determined that a series of two or more spectrum peaks is not detected in step S012 (No in step S012), the process returns to step S001 because motive power transmission mechanism frequencies have not been acquired yet.

In addition, after motive power transmission mechanism frequencies are acquired, in step S014, if inverter noise frequencies are not stored in the inverter noise frequency storage unit 23d (No in step S014), the process returns to step S001.

In the spectrum waveforms shown in FIG. 4, the upper graph shows the case where the belt 161 is normal, in which spectrum peaks appear at $f_s\pm f_{inv}$, $f_s\pm 2\cdot f_{inv}$, $f_s\pm f_b$, and $f_s\pm 2\cdot f_b$. Here, steps S007 to S014 corresponding to the initial learning are performed. For the frequencies $f_p$ of all sideband waves in order from the one near the operation frequency $f_s=60$ (Hz), $f_s/f_p$ is calculated, to determine whether the frequency $f_p$ is the frequency $f_{inv}$ of a series of spectrum peaks due to inverter noise or the frequency $f_b$ of a series of spectrum peaks due to the motive power transmission mechanism. Specifically, $f_s$ is 60 Hz, $f_{inv}$ is 20 Hz, and $f_b$ is 13.2 Hz, so that $f_s/f_{inv}$ is 3 which is an integer value and $f_s/f_b$ is 4.55 which is not an integer value.

Here, $f_s$ and $f_{inv}$ are discrete values and include decimal points, and therefore often do not become integer values when calculated by a calculation device such as a microcomputer or a personal computer, but become very close to integer values. On the other hand, $f_s/f_b$ is 4.55 and thus is not an integer value. Therefore, identification determination for spectrum peaks by integer value determination for the calculated value of $f_s/f_p$ can be said to have high accuracy.

In a case where $f_s/f_b$ is an integer value, determination can be performed by executing calculation again at another operation frequency or on the basis of whether or not the spectrum peak moves when the load is changed under the same operation frequency. Regarding the latter method, if the operation frequency of the electric motor control device is constant, theoretically, a spectrum peak due to inverter noise does not move. On the other hand, for a frequency due to the motive power transmission mechanism, a slip s changes through load change, so that the spectrum peak moves by an amount corresponding to the slip. By detecting the difference therebetween, it is possible to discriminate the spectrum peak due to inverter noise and the spectrum peak due to the motive power transmission mechanism more accurately.

Here, the spectrum peaks due to inverter noise and the spectrum peaks due to the motive power transmission mechanism both form a series of two or more spectrum peaks.

The inverter noise frequencies, the motive power transmission mechanism frequencies, and the intensities of the spectrum peaks for these frequencies are acquired through the initial learning in steps S001 to S014.

With reference to the flowcharts in FIG. 5A and FIG. 5B again, in step S014, if it is determined that inverter noise frequencies and motive power transmission mechanism frequencies have already been acquired, the initial learning is finished, and in step S015, abnormality diagnosis is started. In abnormality diagnosis, current FFT analysis is performed as in the initial learning, and then spectrum peaks due to inverter noise, which have already been acquired in the initial learning, are extracted, and abnormality diagnosis is performed on the basis of other spectrum peaks.

In step S016, whether or not there is abnormality in the motive power transmission mechanism is determined, and if it is determined that there is abnormality, the result is stored in the diagnosis result storage unit 28, and in step S017, alarm and indication are performed.

<Abnormality Diagnosis Procedure 2 for Motive Power Transmission Mechanism 16: Abnormality Diagnosis>

Figure 6:
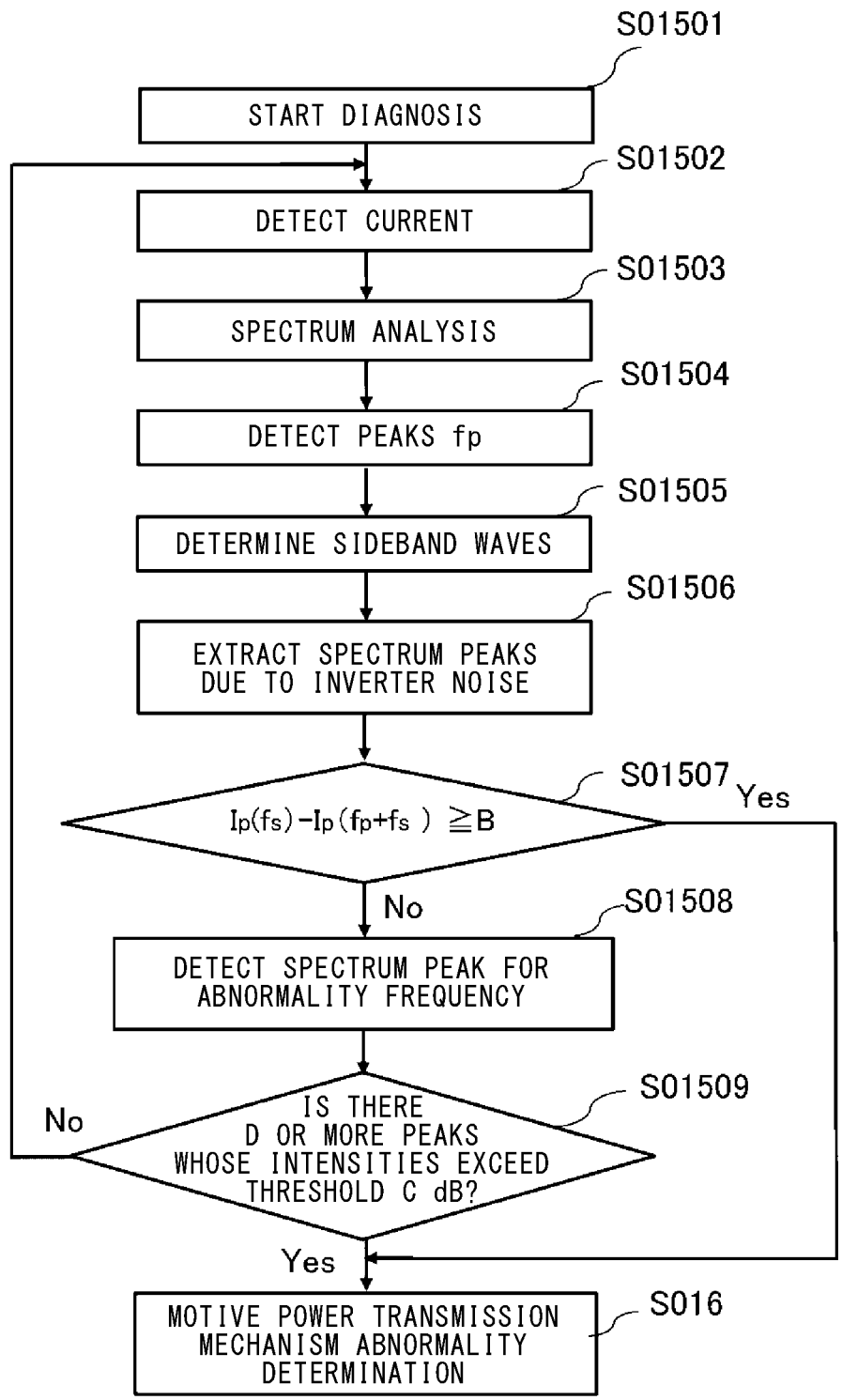
FIG. 6 is a flowchart showing the procedure for performing abnormality diagnosis using the abnormality diagnosis device according to embodiment 1.

Next, the procedure for abnormality diagnosis in step S015 will be described with reference to a flowchart in FIG. 6.

When diagnosis is started in step S01501, in step S01502, current flowing through the electric motor 15 is detected by the current detector 14.

In step S01503, the detected current is subjected to current FFT analysis by the spectrum analysis unit 25a, to acquire a spectrum waveform.

In step S01504, the sideband wave analysis unit 25b detects all spectrum peaks from the spectrum waveform, and determines that spectrum peaks satisfying a condition of sideband waves are sideband waves, among the detected spectrum peaks (step S01505).

Here, steps S01502 to S01505 are the same as steps S002 to S005.

From the spectrum peaks determined to be sideband waves in step S01505, the frequencies of spectrum peaks due to inverter noise are extracted using information such as the frequencies of spectrum peaks due to inverter noise, stored in the inverter noise frequency storage unit 23d (step S01506).

In step S01507, for sideband waves other than the sideband waves of the spectrum peaks due to inverter noise, whether or not a difference between the signal intensity of the operation frequency $f_s$ and the signal intensity at the position of the frequency of the spectrum peak due to the motive power transmission mechanism is the threshold B (dB) or greater, is determined using information such as the frequencies of the spectrum peaks due to the motive power transmission mechanism, stored in the motive power transmission mechanism frequency storage unit 23e.

Originally, in a case where there is no abnormality in the belt, as determined in step S011, the intensity $I_p(f_s\pm f_p)$ of the spectrum peak due to the motive power transmission mechanism is comparatively great and is within a certain range from the signal intensity $I_p(f_s)$ for the operation frequency $f_s$. Therefore, the abnormality determination unit 27 can determine abnormality of the motive power transmission mechanism by determining whether or not a difference between the signal intensity $I_p(f_s\pm f_b)$ for the frequency $f_s\pm f_b$ and the signal intensity $I_p(f_s)$ for $f_s$ is the predetermined threshold B (dB) or greater, on the basis of the spectrum waveform acquired in diagnosis.

As described above, in the spectrum waveform of the lower graph in FIG. 4, the spectrum peaks that should be present at the positions of $f_s\pm f_b$ and $f_s\pm 2\cdot f_b$ have disappeared. Therefore, in step S01507, if it is determined that $I_p(f_s)-I_p(f_s\pm f_b)\geq B$ is satisfied, the process proceeds to step S016, to determine that there is abnormality in the motive power transmission mechanism, i.e., the belt has broken. If it is determined that there is abnormality in the motive power transmission mechanism, the result is stored in the diagnosis result storage unit 28, and in step S017, alarm and indication are performed.

The threshold B used in step S01507 is stored in the determination reference storage unit 23a, and may be the same value as the constant A used in determination in step S011. However, considering aging of the power transmission mechanism, it is desirable that the threshold B is greater than the constant A.

In step S01507, if it is determined that $I_p(f_s)-I_p(f_s\pm f_b)<B$ is satisfied, a spectrum peak that is not a sideband wave among the spectrum peaks detected in step S01504 is detected as a spectrum peak for an abnormality frequency (step S01508).

In step S01509, if D or more spectrum peaks whose signal intensities exceed the threshold C (dB) stored in advance in the determination reference storage unit 23a are detected (Yes in step S01509), it is determined that there is abnormality (step S016). As described above, the number D of spectrum peaks used in abnormality determination is, for example, 2, and is not limited to 2. Desirably, the number D is not less than 2.

The abnormality diagnosis using the abnormality frequency peak may be performed using a method described in Patent Document 1, for example.

As described above, abnormality diagnosis of the motive power transmission mechanism 16 is performed by repeating steps S01501 to S01509.

Next, a case where the operation frequency $f_s$ of the electric motor control device 80 at the time of diagnosis has changed from that at the time of learning, will be described with reference to FIG. 7 and FIG. 8. The operation frequency $f_s$ of the electric motor control device 80 is changed as appropriate in accordance with a drive condition of the electric motor, or the like. In the following description, the procedure for specifying the operation frequency $f_s$ of the electric motor control device 80 at the time of diagnosis, is also described.

Figure 7:
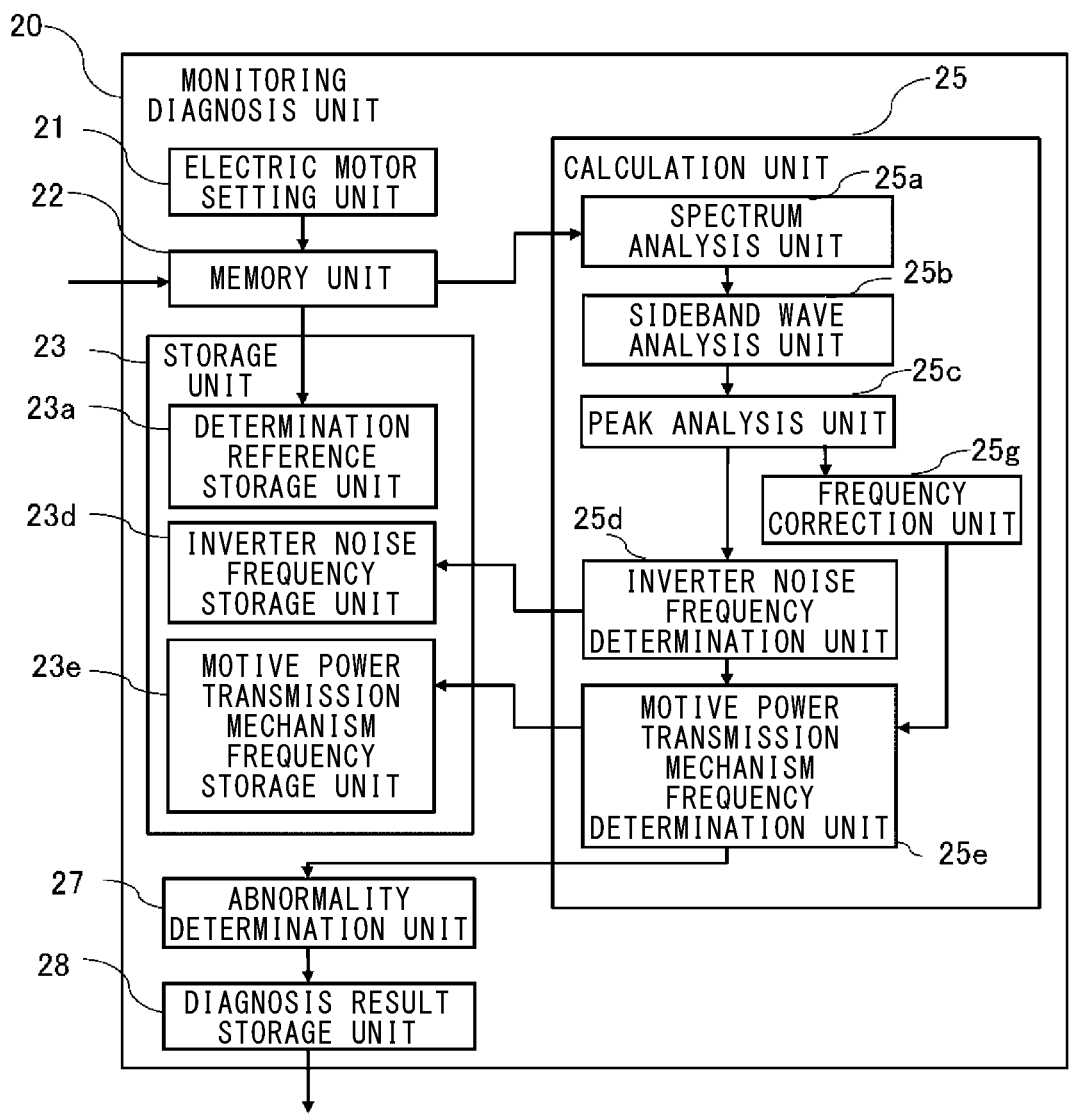
FIG. 7 is a block diagram showing another configuration of the monitoring diagnosis unit according to embodiment 1.
Figure 8:
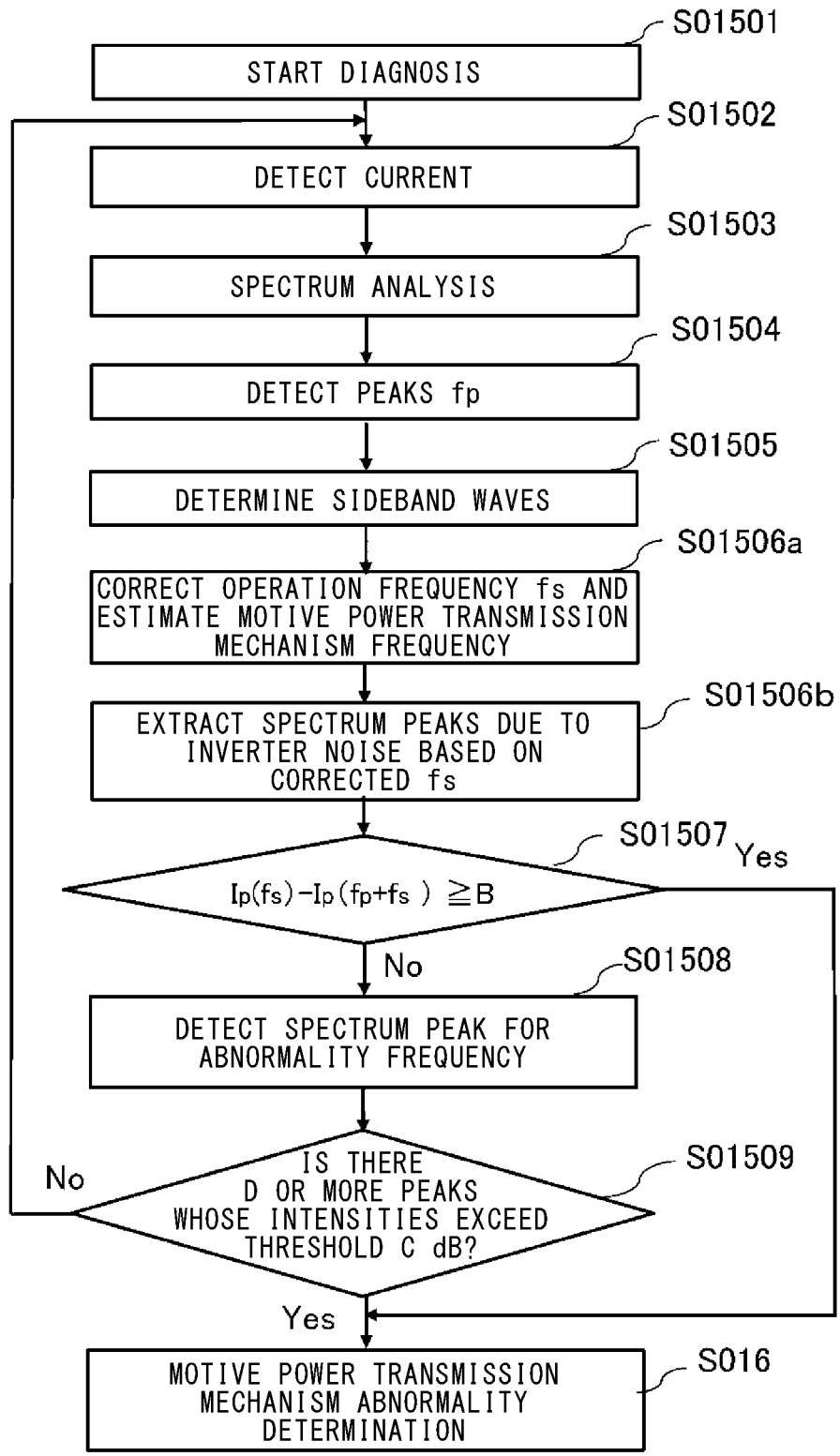
FIG. 8 is a flowchart showing another procedure for performing abnormality diagnosis using the abnormality diagnosis device according to embodiment 1.

FIG. 7 is a block diagram showing the configuration of the monitoring diagnosis unit 20 further including a frequency correction unit 25g in the calculation unit 25 in FIG. 3. FIG. 8 is a flowchart of abnormality diagnosis according to a modification of embodiment 1, and is partially changed from FIG. 6.

When diagnosis is started in step S01501, in step S01502, current flowing through the electric motor 15 is detected by the current detector 14.

In step S01503, the detected current is subjected to current FFT analysis by the spectrum analysis unit 25a, to acquire a spectrum waveform.

In step S01504, the sideband wave analysis unit 25b detects all spectrum peaks from the spectrum waveform, and determines that spectrum peaks satisfying a condition of sideband waves are sideband waves, among the detected spectrum peaks (step S01505).

The spectrum peak having the greatest signal intensity among the spectrum peaks detected in step S01504 is the spectrum peak for the operation frequency $f_s$ of the electric motor control device 80. Therefore, the operation frequency $f_s$ of the electric motor control device 80 acquired at the time of learning, and the frequency of the spectrum having the greatest signal intensity acquired at the time of diagnosis, are compared with each other, and if both frequencies are different from each other, it is determined that the operation frequency of the electric motor control device 80 has changed. If the operation frequency of the electric motor control device 80 has not changed, diagnosis is performed through the procedure in the flowchart in FIG. 6.

In step S01506a, the frequency correction unit 25g corrects the operation frequency $f_s$ of the electric motor control device 80 to the frequency of the spectrum peak having the greatest signal intensity as the operation frequency $f_s$ at the time of diagnosis, to estimate the frequency of the spectrum peak due to the motive power transmission mechanism.

Using Expression (1) and Expression (3), the frequency band $f_b$ where the spectrum peak due to the motive power transmission mechanism appears can be represented by the following expression.

$$f_b = f_s \cdot 4\Pi D_r(1-s)p/L$$

That is, it is found that $f_b$ changes with the operation frequency $f_s$. Among the other values, $D_r$, L, and p are constant and only the value of s (slip) changes slightly but this change is small enough that s is regarded as almost constant. That is, if the operation frequency $f_s$ has been acquired and stored at the time of learning, when the operation frequency is changed, the position (frequency band $f_b$) of the motive power transmission mechanism frequency can be estimated.

For example, a case where the operation frequency $f_s$ changes from 60 Hz to 30 Hz through change in inverter operation of the electric motor control device 80, is assumed. It is assumed that, when the operation frequency $f_s$ is 60 Hz, $f_b$ is 13.2 Hz. When the operation frequency $f_s$ changes to 30 Hz, $f_b$ changes from 13.2 Hz to about 6.6 Hz. Therefore, in step S01504, after it is detected that the operation frequency $f_s$ has changed to 30 Hz, the position (frequency band $f_b$) of the motive power transmission mechanism frequency can be estimated, and the spectrum peak corresponding to $f_b$ is extracted from the spectrum peaks extracted as sideband waves in step S01505. Then, as performed in learning, determination for the motive power transmission mechanism frequencies is performed (steps S007 to S012), whereby the motive power transmission mechanism frequencies are specified.

Next, in step S01506b, spectrum peaks due to inverter noise based on the corrected operation frequency $f_s$ (operation frequency $f_s$ of the electric motor control device 80 at the time of diagnosis) are figured out and extracted from the spectrum peaks at the time of diagnosis. The spectrum peaks due to inverter noise based on the corrected operation frequency $f_s$ may be determined through the same procedure as in steps S007 to S010 at the time of learning. The subsequent steps from step S01507 are the same as those described in FIG. 6.

As described above, in a case where the operation frequency $f_s$ of the electric motor control device 80 at the time of diagnosis has changed from that at the time of learning, estimation for the frequency band $f_b$ of the motive power transmission mechanism frequency and determination for spectrum peaks due to inverter noise are performed on the basis of the corrected operation frequency $f_s$, whereby it is possible to perform abnormality diagnosis without erroneous detection when the operation frequency changes.

Such a case where the operation frequency $f_s$ of the electric motor control device 80 at the time of diagnosis has changed from that at the time of learning, refers to a case where the operation frequency $f_s$ stored in association with the frequencies stored in the inverter noise frequency storage unit 23d and the motive power transmission mechanism frequency storage unit 23e is different from the operation frequency $f_s$ of the electric motor control device 80 at the time of diagnosis, i.e., there is no learning result for the operation frequency $f_s$. Therefore, if frequencies corresponding to a plurality of operation frequencies $f_s$ are stored in the inverter noise frequency storage unit 23d and the motive power transmission mechanism frequency storage unit 23e through repeated learning, those frequencies can be used. In the above case, there is no learning result, and therefore there is no data that should be taken from the frequencies stored in the inverter noise frequency storage unit 23d and the motive power transmission mechanism frequency storage unit 23e. For example, even when the operation frequency $f_s$ of the electric motor control device 80 at the time of last learning and the operation frequency $f_s$ of the electric motor control device 80 at the time of diagnosis are different from each other, if there is already a corresponding learning result as in a case where frequencies corresponding to the operation frequency $f_s$ at the time of diagnosis are stored in the inverter noise frequency storage unit 23d and the motive power transmission mechanism frequency storage unit 23e, those frequencies may be used.

As described above, according to embodiment 1, for the electric motor drive-controlled by the inverter, in initial learning, current flowing through the electric motor is detected, and if, among sideband waves extracted through FFT analysis of the detected current, sideband waves having such frequencies that $f_s/f_p$ is an integer with respect to the operation frequency $f_s$ of the electric motor control device form a series of two or more spectrum peaks, the sideband waves are determined to be sideband waves due to inverter noise, and those frequencies and the like are stored. Thus, in abnormality diagnosis, spectrum peaks due to inverter noise can be extracted from the spectrum peaks extracted through current FFT analysis, whereby erroneous diagnosis due to inverter noise does not occur and diagnosis accuracy is improved.

In initial learning, among the sideband waves extracted through FFT analysis of current flowing through the electric motor, if there are sideband waves having such frequencies that $f_s/f_p$ is not an integer with respect to the operation frequency $f_s$ of the electric motor control device and a difference between the signal intensity thereof and the signal intensity for the operation frequency of the electric motor control device is the constant A or less, and the sideband waves form a series of two or more spectrum peaks, those sideband waves are determined to be sideband waves due to the motive power transmission mechanism and the frequencies and the like thereof are stored. Thus, in abnormality diagnosis, by comparing the signal intensities of the frequencies due to the motive power transmission mechanism with the stored signal intensities, abnormality of the motive power transmission mechanism, i.e., belt breakage or the like, can be easily diagnosed.

In diagnosis, when the operation frequency $f_s$ of the electric motor control device is determined, if there is no learning result for that operation frequency $f_s$ until then, sideband waves due to the motive power transmission mechanism are estimated using the already learned operation frequency $f_s$, and the operation frequency $f_s$ of the electric motor control device at the time of diagnosis is used as the operation frequency to extract spectrum peaks due to inverter noise, whereby abnormality diagnosis can be performed without erroneous diagnosis.

Embodiment 2

Hereinafter, an abnormality diagnosis device according to embodiment 2 will be described with reference to the drawings.

Figure 9:
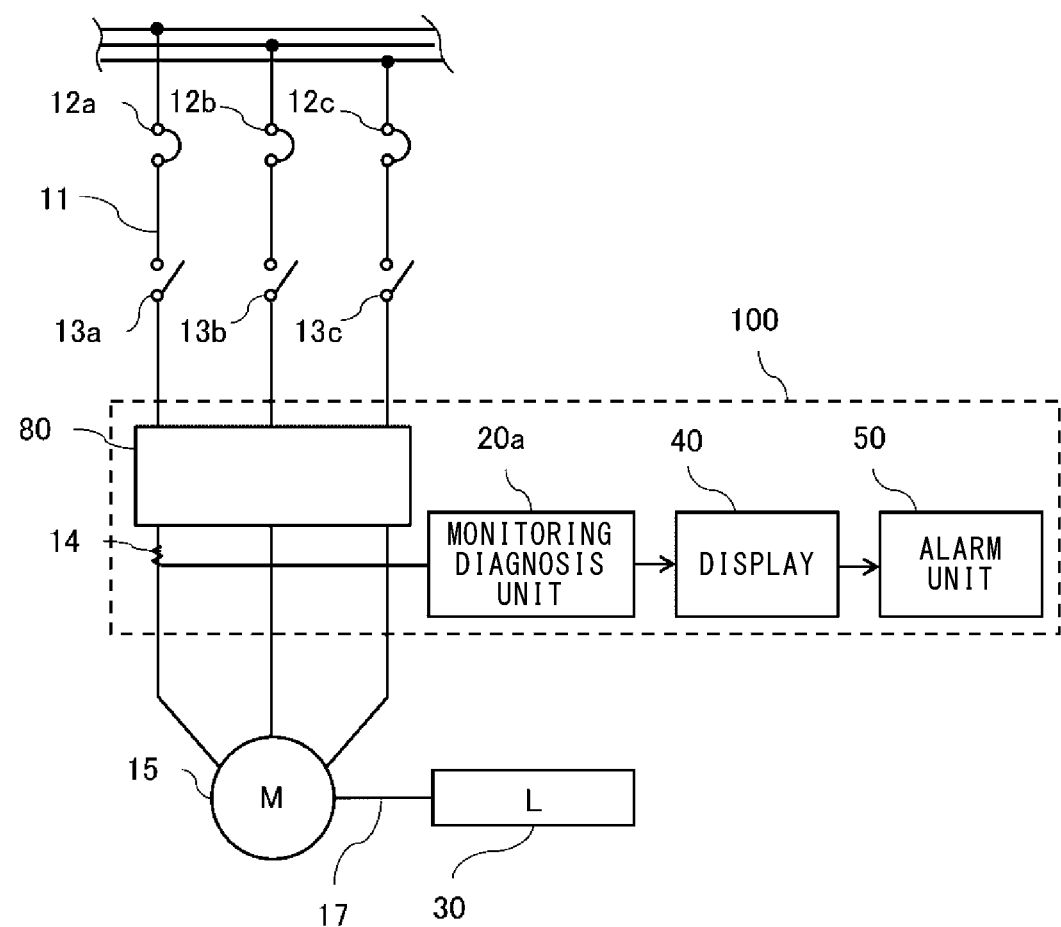
FIG. 9 illustrates the schematic configuration of an abnormality diagnosis device according to embodiment 2.

FIG. 9 illustrates the schematic configuration of the abnormality diagnosis device according to embodiment 2. Normally, the abnormality diagnosis device 100 detects abnormality of the electric motor 15 and abnormality of a motive power transmission mechanism 17 which transmits motive power from the electric motor 15 to the mechanical equipment 30 as a load, and performs abnormality diagnosis. In embodiment 2, an example in which machinery abnormality of the electric motor 15 is detected and abnormality diagnosis is performed, will be described. Therefore, differences from embodiment 1 will be mainly described and description of the same matters is omitted.

In FIG. 9, as the motive power transmission mechanism 17 which transmits motive power from the electric motor 15 to the mechanical equipment 30, a coupling or the like via which rotation of the electric motor 15 is directly transmitted to the mechanical equipment 30 is used, unlike embodiment 1 in which a belt, a speed reduction device, a chain, or the like is used. Therefore, in embodiment 2, abnormality of the motive power transmission mechanism 17 is ignored. The abnormality diagnosis device 100 includes a monitoring diagnosis unit 20a. One monitoring diagnosis unit 20a is provided for one electric motor 15.

<Configuration of Monitoring Diagnosis Unit 20a>

Figure 10:
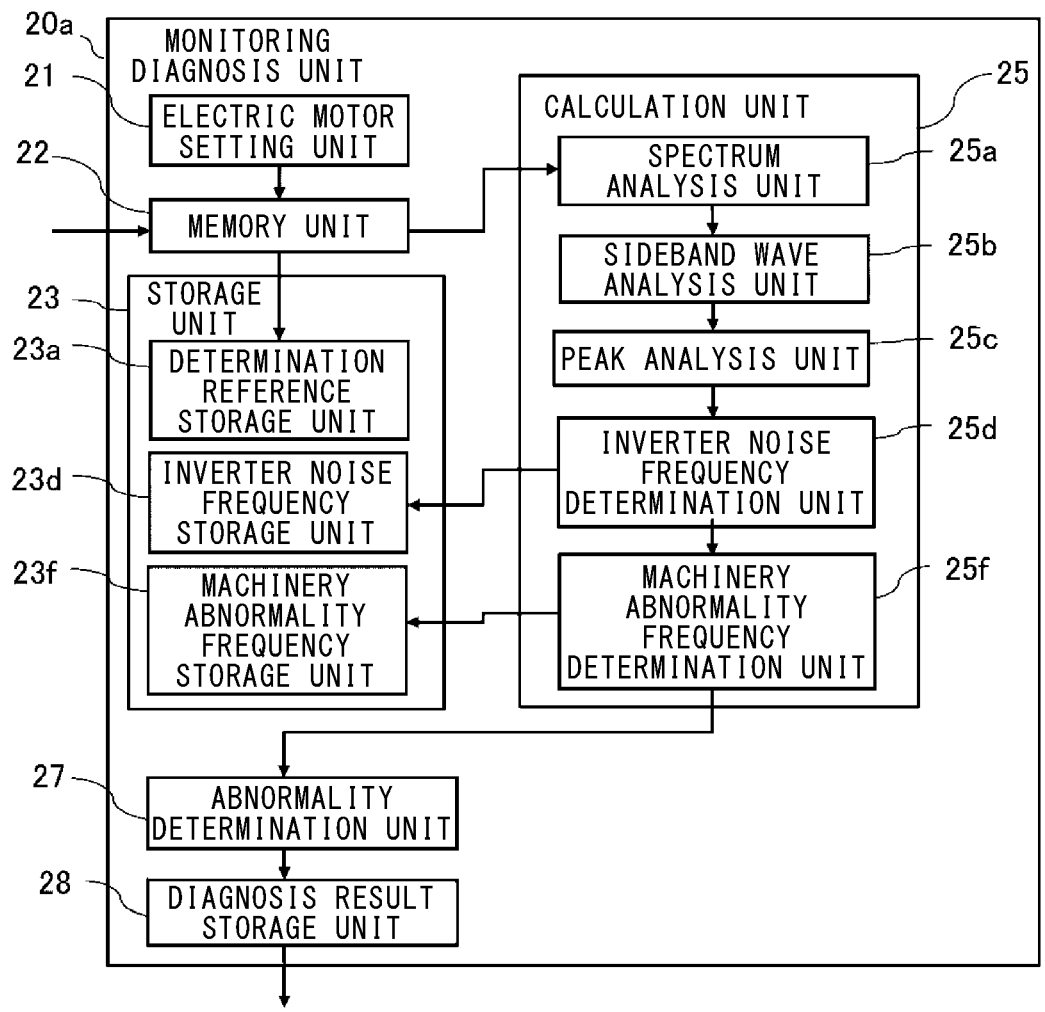
FIG. 10 is a block diagram showing the configuration of a monitoring diagnosis unit according to embodiment 2.

Next, the configuration of the monitoring diagnosis unit 20a will be described. FIG. 10 is a block diagram showing the configuration of the monitoring diagnosis unit 20a of the abnormality diagnosis device 100 according to embodiment 2. In FIG. 10, the monitoring diagnosis unit 20a includes the electric motor setting unit 21, the memory unit 22, the storage unit 23, the calculation unit 25, the abnormality determination unit 27, and the diagnosis result storage unit 28.

In the abnormality diagnosis device 100 according to embodiment 2, a configuration example of the monitoring diagnosis unit 20a for detecting abnormality of the electric motor 15 will be described. The configurations of the electric motor setting unit 21 and the memory unit 22 are the same as in embodiment 1, and the description thereof is omitted.

The storage unit 23 includes the determination reference storage unit 23a, the inverter noise frequency storage unit 23d, and a machinery abnormality frequency storage unit 23f.

The determination reference storage unit 23a is used for storing a threshold and the like for determining abnormality of the machinery of the electric motor 15.

The configuration of the inverter noise frequency storage unit 23d is the same as in embodiment 1.

The machinery abnormality frequency storage unit 23f stores the value of the frequency of a spectrum peak due to abnormality of the machinery of the electric motor. It is desirable to store not only the value of the frequency but also the signal intensity of the spectrum peak, the operation frequency of the electric motor control device 80 when the spectrum peak is acquired, and the signal intensity of the spectrum peak for the operation frequency in the same manner.

The calculation unit 25 includes the spectrum analysis unit 25a, the sideband wave analysis unit 25b, the peak analysis unit 25c, the inverter noise frequency determination unit 25d, and a machinery abnormality frequency determination unit 25f.

The configurations of the spectrum analysis unit 25a, the sideband wave analysis unit 25b, and the peak analysis unit 25c are the same as in embodiment 1.

The machinery abnormality frequency determination unit 25f determines whether or not the frequencies of sideband waves are frequencies due to machinery abnormality of the electric motor, on the basis of a result of analysis by the peak analysis unit 25c. If the frequencies are determined to be due to machinery abnormality, the values of the frequencies of the spectrum peaks are stored in the machinery abnormality frequency storage unit 23f. At the same time, it is preferable to also store the signal intensities of the spectrum peaks, the operation frequency of the electric motor control device 80, and the signal intensity of the spectrum peak for the operation frequency.

The abnormality determination unit 27 determines whether or not there is abnormality of the machinery of the electric motor 15. Examples of abnormality of the machinery of the electric motor 15 include bearing abnormality, an eccentric state, misalignment, imbalance, bolt looseness, backlash, and abnormal vibration. Using a threshold stored in advance in the determination reference storage unit 23a, comparison is performed with the spectrum peaks determined by the machinery abnormality frequency determination unit 25f, to perform abnormality determination.

The diagnosis result storage unit 28 stores the result of determination by the abnormality determination unit 27.

<Analysis of Spectrum Peaks in Calculation Unit 25>

Hereinafter, extraction of machinery abnormality frequencies for the electric motor will be described.

Figure 11:
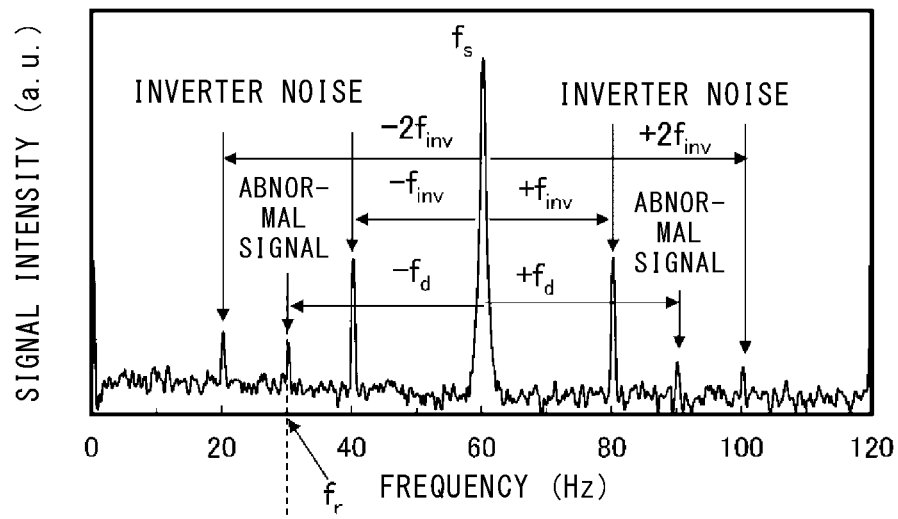
FIG. 11 shows spectrum waveforms which are examples of analysis results by current FFT using the abnormality diagnosis device according to embodiment 2.
Figure 11:
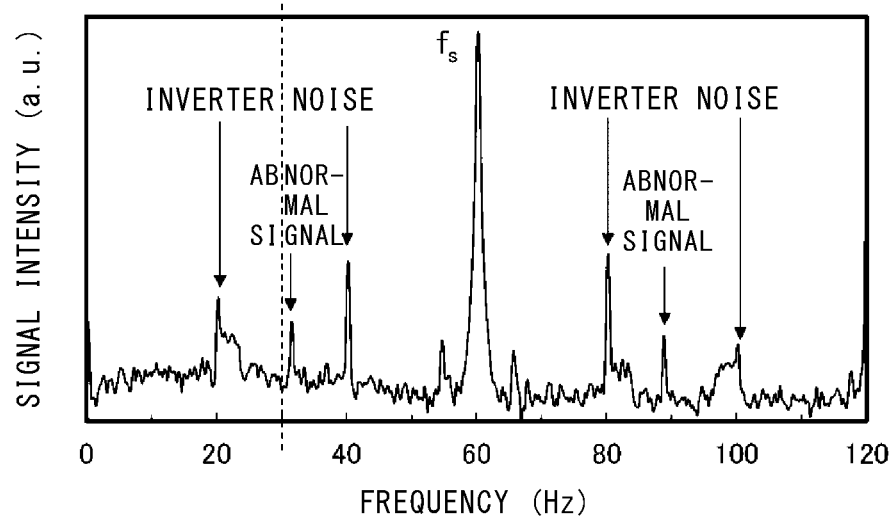

FIG. 11 shows spectrum waveforms of current FFT analysis results in the calculation unit 25 of the monitoring diagnosis unit 20a in embodiment 2. The upper graph shows a case where the electric motor is in a no-load state, and the lower graph shows an operation state under a rated load. In embodiment 2, since the motive power transmission mechanism 17 is a coupling or the like that directly transmits rotation to the load, spectrum peaks due to the motive power transmission mechanism are ignored.

In both of the upper and lower graphs of the spectrum waveforms shown in FIG. 11, sideband waves due to inverter noise are observed at equal intervals on the high-frequency side and the low-frequency side with respect to the operation frequency $f_s$ of the electric motor control device 80. In addition, it is found that, as sideband waves, spectrum peaks due to machinery abnormality of the electric motor 15 appear at $f_s \pm f_d$.

Next, a method for determining whether or not the spectrum peaks shown in FIG. 11 are due to machinery abnormality of the electric motor 15 will be described.

In the peak analysis unit 25c, calculation of Expression (2) is performed. It is known that a spectrum peak due to machinery abnormality of the electric motor 15 appears near the rotational frequency $f_r$ of the electric motor. Here, focusing on the rotational frequency $f_r$ of the electric motor in Expression (3), Expression (2) can be deformed into the following Expression (5).

$$\Delta = f_s/f_p = p/(2 \cdot (1-s)) \quad \text{Expression (5)}$$

Here, in a no-load state, the slip s is 0 and the value of Expression (5) becomes an integral value. Therefore, it is difficult to discriminate the spectrum peak from that due to inverter noise. However, in general, a load is applied to the electric motor 15 and the slip s is not 0. Therefore, if $\Delta$ is not an integer, it can be determined that the spectrum peak is highly likely to be a machinery abnormality frequency. In addition, since it is known that a spectrum peak due to machinery abnormality of the electric motor 15 appears near the rotational frequency $f_r$ of the electric motor 15, a frequency at which a spectrum peak due to machinery abnormality occurs can be estimated from rating information of the electric motor. In Expression (3), it suffices that the number of poles of the electric motor 15 and the operation frequency $f_s$ of the electric motor control device 80 are found. Although the value of the machinery abnormality frequency shifts from the rotational frequency $f_r$ of the electric motor 15 by an amount corresponding to the slip s, the shift amount is about 1 to 2 Hz at maximum.

That is, in the peak analysis unit 25c, $f_s/f_p$ is calculated using Expression (2), and for the sideband wave for which the value of $f_s/f_p$ is an integer, whether or not the frequency of the spectrum peak changes depending on presence/absence of a load is determined. If the frequency does not change, the inverter noise frequency determination unit 25d determines whether or not the spectrum peak is due to inverter noise, as in embodiment 1.

For the spectrum peak for which the value of $f_s/f_p$ calculated by the peak analysis unit 25c is not an integer and the spectrum peak of which the frequency has changed depending on presence/absence of a load although the value of $f_s/f_p$ calculated by the peak analysis unit 25c is an integer, the machinery abnormality frequency determination unit 25f determines whether or not the spectrum peak is near the rotational frequency $f_r$ of the electric motor. Here, a threshold E (Hz) is set in advance, and whether or not the spectrum peak is within the range thereof is determined. The threshold E may be about 1 to 2 (Hz). The threshold may be stored in the determination reference storage unit 23a, or may be stored as a comparison constant for calculating a difference between the frequency of the spectrum peak and the rotational frequency $f_r$ of the electric motor in the machinery abnormality frequency determination unit 25f. If it is determined that the spectrum peak is near the rotational frequency $f_r$ of the electric motor, the frequency of the spectrum is stored in the machinery abnormality frequency storage unit 23f. At the same time, it is preferable to also store the signal intensity of the spectrum peak, the operation frequency of the electric motor control device 80 when the spectrum peak is acquired, and the signal intensity of the spectrum peak for the operation frequency in the same manner.

The abnormality determination unit 27 determines whether or not there is abnormality of the machinery of the electric motor 15. If a difference between the signal intensity of the spectrum peak due to machinery abnormality determined by the machinery abnormality frequency determination unit 25f and the spectrum intensity for the operation frequency $f_s$ of the electric motor control device 80 is F (dB) or less, it is determined that there is abnormality of the machinery. The threshold F (dB) is stored in advance in the determination reference storage unit 23a.

For the spectrum peak due to machinery abnormality determined by the machinery abnormality frequency determination unit 25f, comparison may be performed with a threshold Fa (dB) stored in advance in the determination reference storage unit 23a, and if the threshold Fa (dB) is exceeded, it may be determined that there is abnormality of the machinery. The threshold F (dB) and the threshold Fa (dB) are used for determining that the spectrum peak due to machinery abnormality is sufficiently great.

The threshold used for abnormality determination may be stored in advance in the determination reference storage unit 23a, or data when the electric motor 15 is normal may be stored in the memory unit 22 and statistical processing or the like may be performed thereon, to determine the threshold.

The threshold value may be determined by a method using machine learning, instead of statistical processing. The behavior of data may be learned from normal data of motor equipment of the same type in advance, and the threshold may be determined on the basis of the learned data. Alternatively, patterns of various data of a plurality of electric motors may be learned, various patterns may be classified, and the threshold or the like may be determined from the classified patterns.

<Machinery Abnormality Diagnosis Procedure 1 for Electric Motor 15: Initial Learning>

Next, an abnormality diagnosis method according to the present embodiment 2 will be described with reference to the drawings.

Figure 12A:
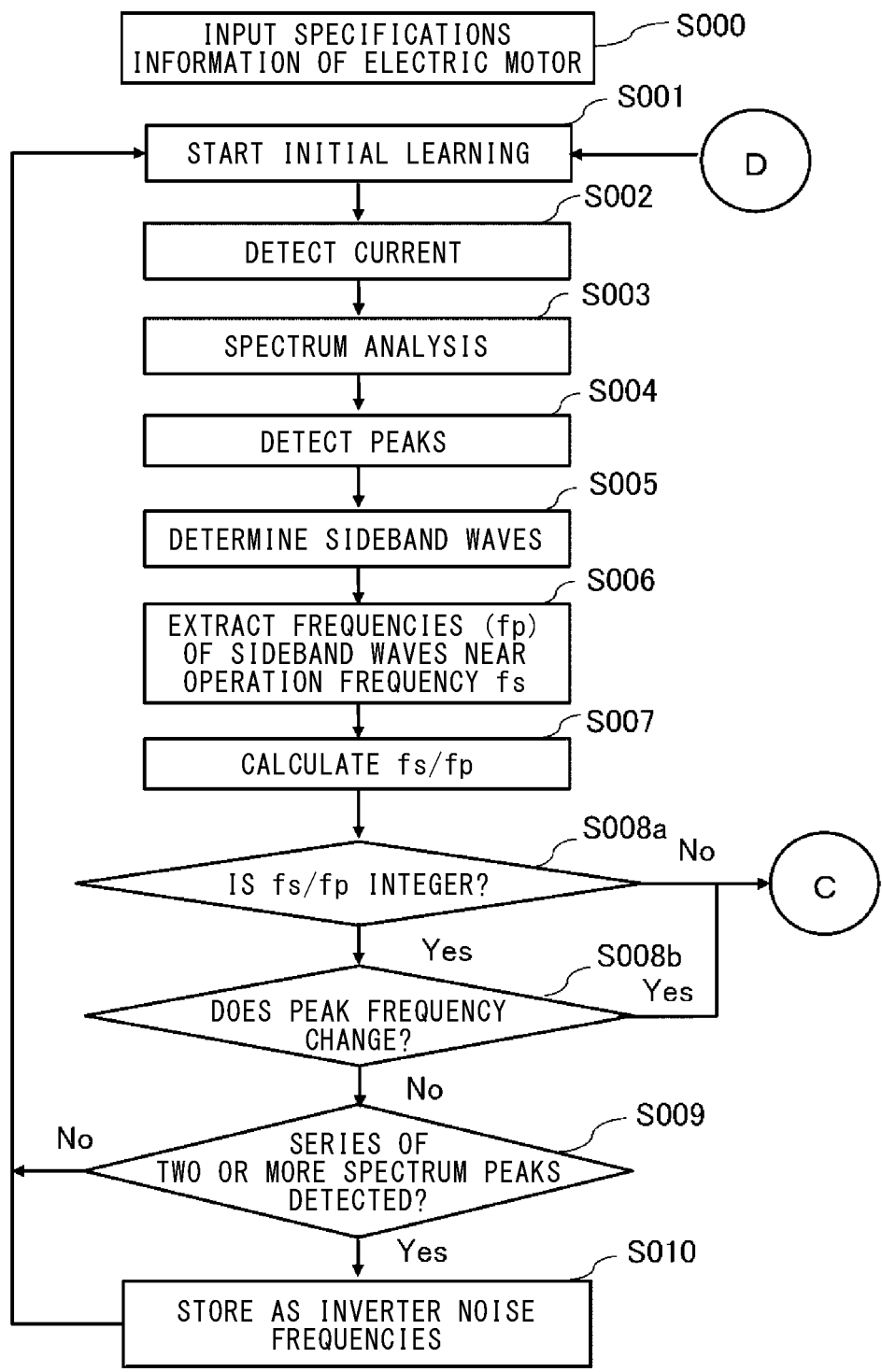
FIG. 12A is a flowchart showing the entire procedure for performing abnormality diagnosis of machinery of an electric motor using the abnormality diagnosis device according to embodiment 2.
Figure 12B:
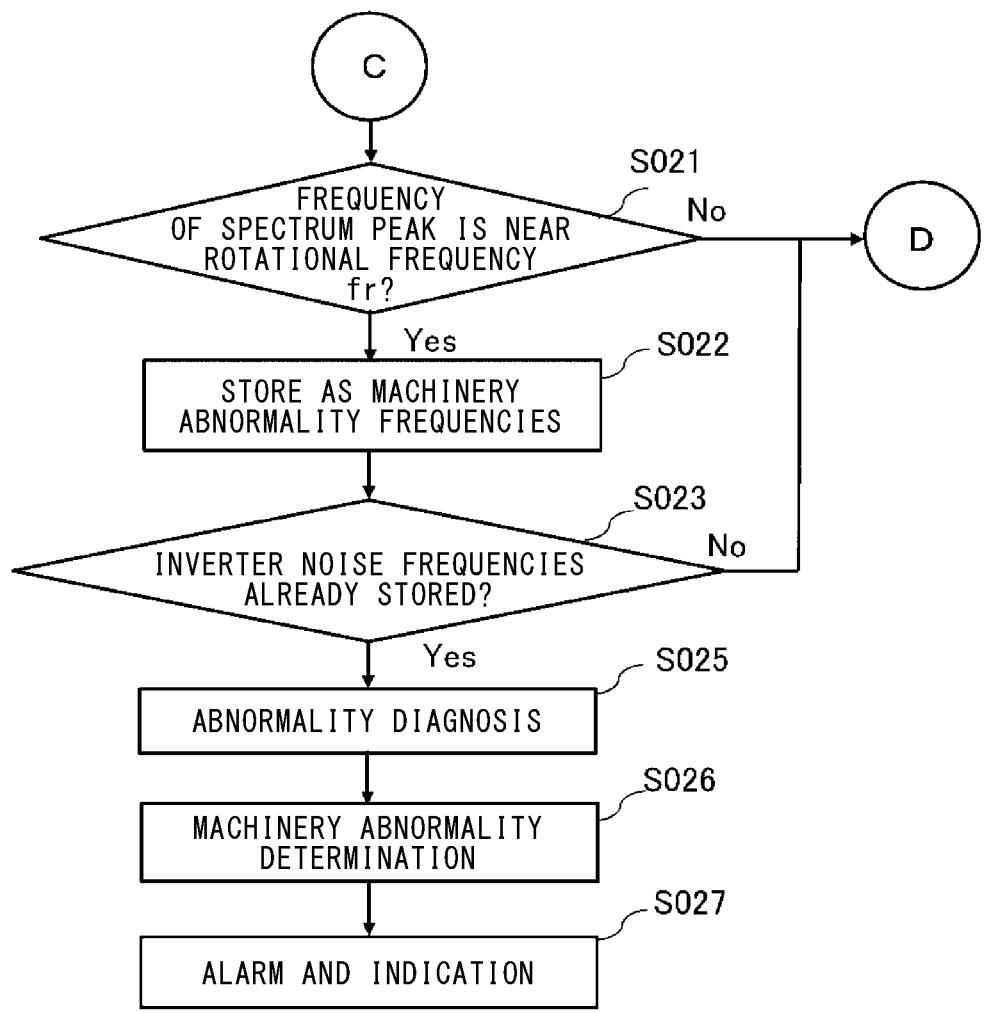
FIG. 12B is a flowchart showing the entire procedure for performing abnormality diagnosis of machinery of the electric motor using the abnormality diagnosis device according to embodiment 2.

FIG. 12A and FIG. 12B are flowcharts showing the procedures for diagnosing abnormality of the machinery of the electric motor according to embodiment 2.

The process from step S000 in which specifications of the electric motor are inputted to step S007 in which $f_s/f_p$ is calculated, is the same as in embodiment 1, and the description thereof is omitted.

If the value of $f_s/f_p$ calculated by the peak analysis unit 25c is an integer (Yes in step S008a), the process proceeds to step S008b, to determine whether or not the frequency of the sideband wave for which the value of $f_s/f_p$ is an integer changes between a rated-load operation state and a no-load operation state of the electric motor 15. Here, control is performed at the same operation frequency $f_s$, between the rated-load operation state and the no-load operation state of the electric motor 15.

In step S008b, if it is determined that there is no change (No in step S008b), the process proceeds to step S009, to perform inverter noise frequency determination as in embodiment 1.

If the calculated value of $f_s/f_p$ is not an integer in step S008a (No in step S008a) and if it is determined that there is change in step S008b (Yes in step S008b), the process proceeds to step S021.

In step S021, the machinery abnormality frequency determination unit 25f determines whether or not the spectrum peak is near the rotational frequency $f_r$ of the electric motor 15. If it is determined that the spectrum peak is near the rotational frequency $f_r$ of the electric motor 15 (Yes in step S021), the frequency of the spectrum is stored as a machinery abnormality frequency in the machinery abnormality frequency storage unit 23f (step S022).

Next, in step S023, if it is determined that inverter noise frequencies have already been stored in the inverter noise frequency storage unit 23d, the initial learning is finished because inverter noise frequencies and machinery abnormality frequencies have already been acquired.

In step S021, if it is not determined that the spectrum peak is near the rotational frequency $f_r$ of the electric motor 15 (No in step S021), the process returns to step S001 because machinery abnormality frequencies have not been acquired yet.

In addition, after machinery abnormality frequencies are acquired, in step S023, if it is determined that inverter noise frequencies are not stored in the inverter noise frequency storage unit 23d (No in step S023), the process returns to step S001.

Next, abnormality diagnosis is started in step S025.

In step S026, whether or not there is abnormality in the machinery of the electric motor is determined. Here, current FFT analysis is performed as in the initial learning, and then spectrum peaks due to inverter noise, which have already been acquired in the initial learning, are extracted, and abnormality diagnosis is performed on the basis of other spectrum peaks.

If it is determined that there is abnormality, the result is stored in the diagnosis result storage unit 28, and in step S027, alarm and indication are performed.

<Abnormality Diagnosis Procedure 2 for Machinery of Electric Motor 15: Abnormality Diagnosis>

Figure 13:
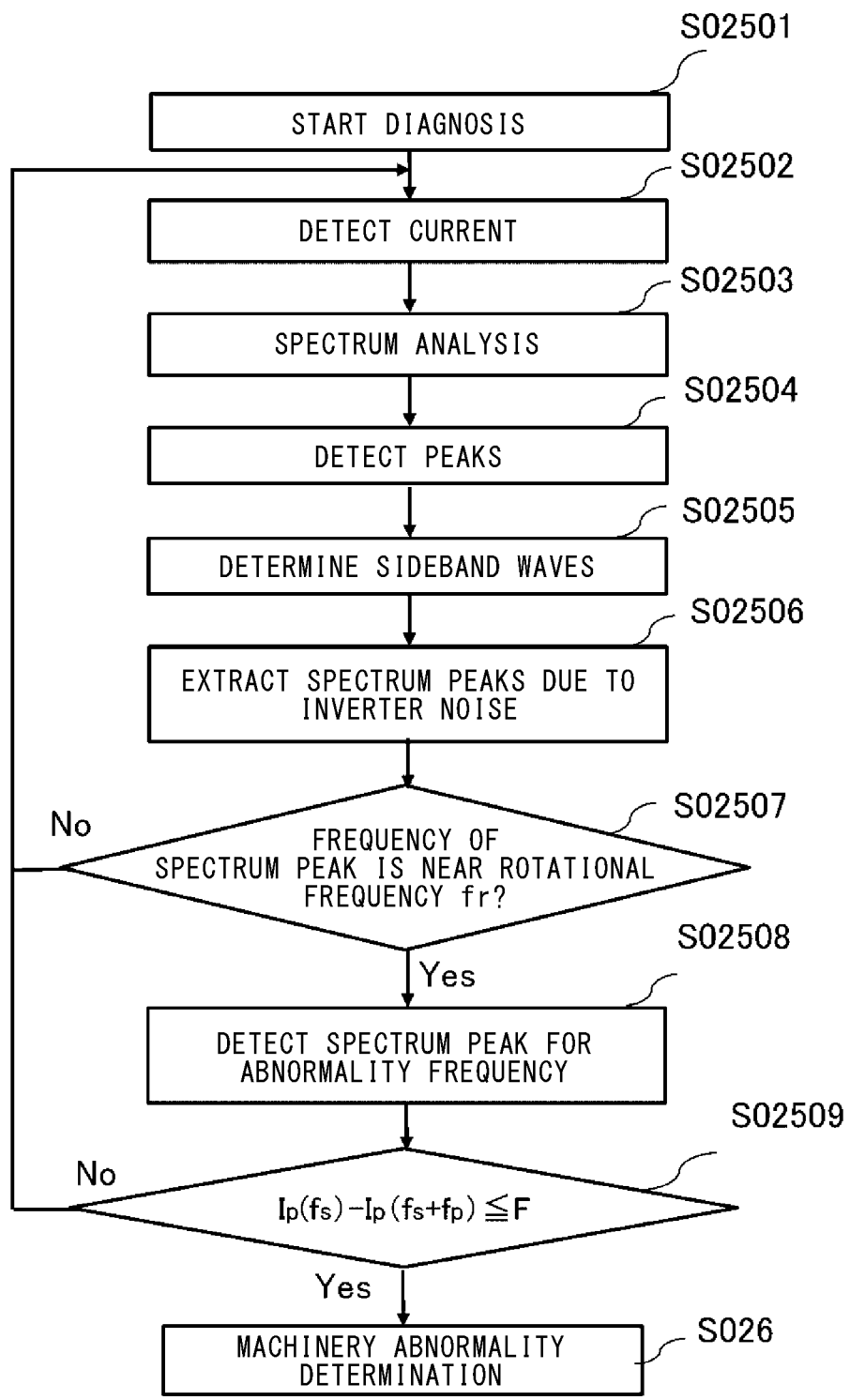
FIG. 13 is a flowchart showing the procedure for performing abnormality diagnosis using the abnormality diagnosis device according to embodiment 2.

Next, the procedure for abnormality diagnosis in step S025 will be described with reference to a flowchart in FIG. 13.

Steps S02501 to S02505 are the same as steps S002 to S005.

In step S02506, from the spectrum peaks determined to be sideband waves, the frequencies of spectrum peaks due to inverter noise are extracted using information such as the frequencies of spectrum peaks due to inverter noise, stored in the inverter noise frequency storage unit 23d.

In step S02507, whether or not the spectrum peak determined to be a sideband wave is present near the rotational frequency $f_r$ of the electric motor 15 is determined. If the spectrum peak is present near the rotational frequency $f_r$ of the electric motor 15 (Yes in step S02507), the spectrum peak is highly likely to be a sideband wave due to abnormality of the machinery of the electric motor, and in step S02508, the frequency $f_p$ of the spectrum peak and the signal intensity $I_p(f_s \pm f_p)$ thereof are detected.

In step S02509, a difference between the signal intensity $I_p(f_s \pm f_p)$ of the spectrum peak of the sideband wave due to machinery abnormality of the electric motor and the signal intensity $I_p(f_s)$ for the operation frequency $f_s$ of the electric motor control device 80 is calculated. If it is determined that $I_p(f_s) - I_p(f_s \pm f_p) \leq F$ is satisfied (Yes in step S02509), the spectrum peak of the sideband wave due to machinery abnormality of the electric motor is sufficiently great and it is determined that there is abnormality in the machinery (step S026).

If it is determined that there is abnormality in the machinery of the electric motor, the result is stored in the diagnosis result storage unit 28, and in step S027, alarm and indication are performed.

Here, in step S02507, spectrum peaks due to inverter noise are also included in the sideband waves. Therefore, in a case of performing abnormality diagnosis, the electric motor 15 may be operated in a state with a load and in a state with no load, and only for the spectrum peak of which the frequency changes between both states, the subsequent steps from step S02507 may be executed.

In a case where the operation frequency $f_s$ of the electric motor control device 80 and the rotational frequency $f_r$ of the electric motor are known in advance, whether or not the frequency $f_{inv}$ of a spectrum peak due to inverter noise and the rotational frequency $f_r$ overlap each other can be found, and therefore the subsequent steps from step S02507 may be executed using the above fact.

As described above, abnormality diagnosis of the machinery of the electric motor 15 is performed by repeating steps S02501 to S02509.

Next, whether or not the spectrum peaks shown in FIG. 11 are those due to machinery abnormality of the electric motor 15, is determined. In FIG. 11, $f_s$ is 60 (Hz) and $f_r$ is 30 (Hz). First, in the no-load case shown in the upper graph, sideband waves are detected from the detected spectrum peaks. Next, $f_s/f_p$ is calculated. Since $f_{inv}$ is 20 (Hz) and $f_d$ is 30 (Hz), $f_s/f_{inv}$ is 3 and $f_s/f_d$ is 2.

Here, a spectrum peak present near the rotational frequency $f_r$ of the electric motor is a spectrum peak having the frequency $f_d$ of a sideband wave and does not overlap a spectrum peak that coincides with $f_{inv}$ stored together with the operation frequency $f_s$ in the inverter noise frequency storage unit 23d. Meanwhile, the spectrum peak present near the rotational frequency $f_r$ of the electric motor coincides with $f_d$ stored together with the operation frequency $f_s$ and the rotational frequency $f_r$ in the machinery abnormality frequency storage unit. Therefore, the spectrum peak present near the rotational frequency $f_r$ of the electric motor is determined to be a machinery abnormality frequency, and the signal intensity thereof is compared with the signal intensity of the spectrum peak for the operation frequency $f_s$. If a difference therebetween is the threshold F or less, it is determined that there is abnormality.

Alternatively, in diagnosis, spectrum analysis in the rated-load state is performed and a spectrum waveform in the rated-load state as shown in the lower graph in FIG. 11 is acquired. In the rated-load state, the spectrum peak due to machinery abnormality changes, so that the frequency $f_d$ of the sideband wave becomes 28.8 Hz, and thus $f_s/f_d$ is 2.08, which is not an integer value. Therefore, a spectrum peak present near the rotational frequency $f_r$ of the electric motor may be determined to be a machinery abnormality frequency, and the signal intensity thereof may be compared with the signal intensity of the spectrum peak for the operation frequency $f_s$.

As described above, according to embodiment 2, for the electric motor drive-controlled by the inverter, in initial learning, current flowing through the electric motor is detected, and if, among sideband waves extracted through FFT analysis of the detected current, sideband waves having such frequencies that $f_s/f_p$ is an integer with respect to the operation frequency $f_s$ of the electric motor control device do not change depending on presence/absence of a load and form a series of two or more spectrum peaks, the sideband waves are determined to be sideband waves due to inverter noise, and those frequencies and the like are stored. Thus, in abnormality diagnosis, spectrum peaks due to inverter noise can be extracted from the spectrum peaks extracted through current FFT analysis, whereby erroneous diagnosis due to inverter noise does not occur and diagnosis accuracy is improved.

In initial learning, among the sideband waves extracted through FFT analysis of current flowing through the electric motor, a spectrum peak which is present near the rotational frequency $f_r$ of the electric motor and of which the spectrum peak frequency or the sideband wave frequency changes depending on presence/absence of a load, is determined to be a sideband wave due to machinery abnormality of the electric motor, and the frequency and the like thereof are stored. Thus, in abnormality diagnosis, whether or not the frequency of a spectrum peak is a frequency due to machinery abnormality of the electric motor can be determined, and by comparing the signal intensity of the spectrum peak due to machinery abnormality with a predetermined threshold, machinery abnormality of the electric motor can be easily diagnosed.

Embodiment 3

Hereinafter, an abnormality diagnosis device according to embodiment 3 will be described with reference to the drawings.

Figure 14:
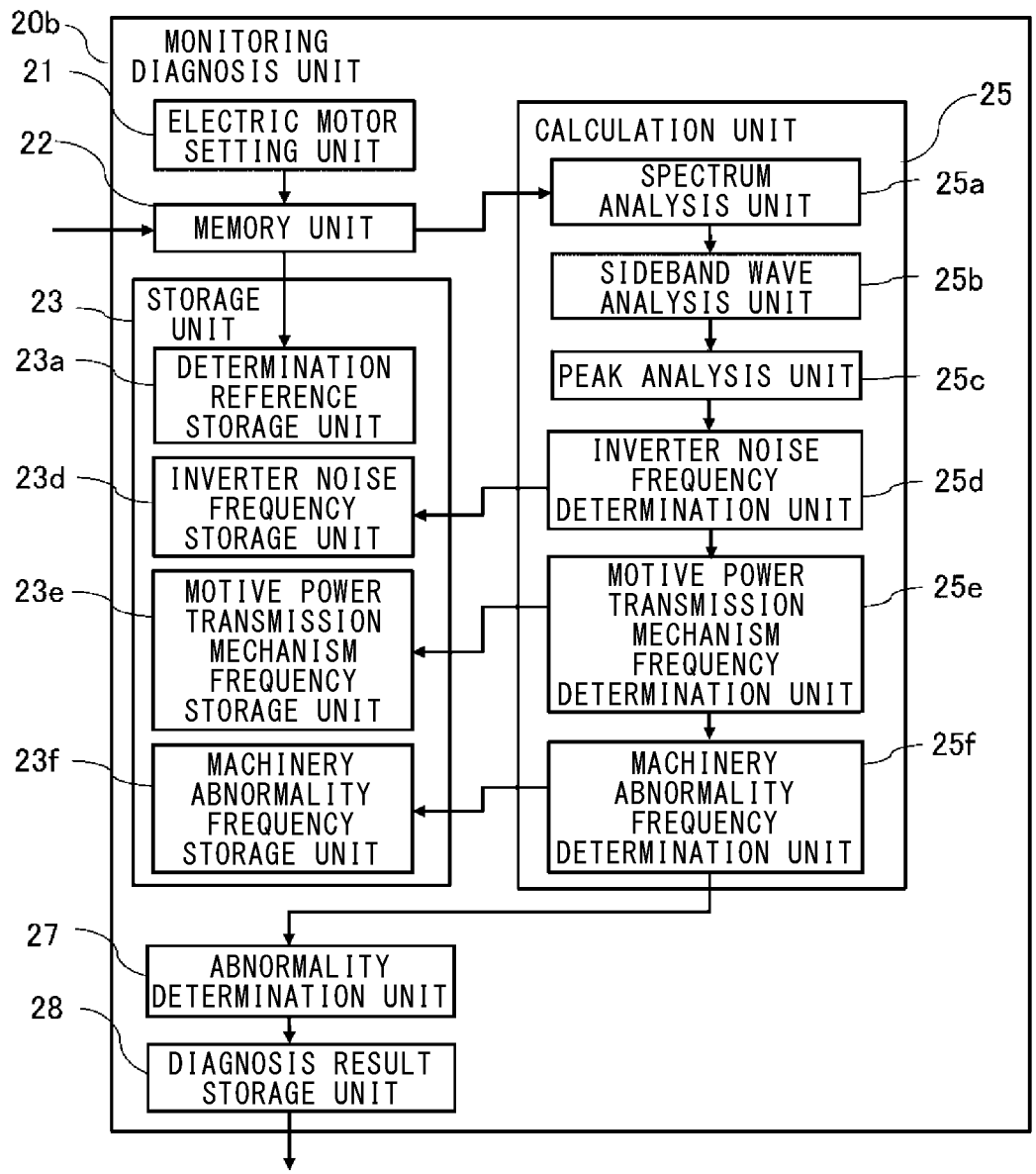
FIG. 14 is a block diagram showing the configuration of a monitoring diagnosis unit according to embodiment 3.

FIG. 14 is a block diagram showing the configuration of a monitoring diagnosis unit 20b of the abnormality diagnosis device according to embodiment 3. FIG. 14 shows the configuration of the monitoring diagnosis unit 20b for diagnosing both of abnormality of the motive power transmission mechanism 16 and machinery abnormality of the electric motor 15 in a case where the motive power transmission mechanism 16 such as a belt is attached between the electric motor 15 and the mechanical equipment 30 in the configuration shown in FIG. 1.

Therefore, the storage unit 23 includes both of the motive power transmission mechanism frequency storage unit 23e and the machinery abnormality frequency storage unit 23f, and the calculation unit 25 includes both of the motive power transmission mechanism frequency determination unit 25e and the machinery abnormality frequency determination unit 25f. The other configurations are the same as in embodiments 1 and 2.

Next, an abnormality diagnosis method according to the present embodiment 3 will be described with reference to the drawings.

Figure 15A:
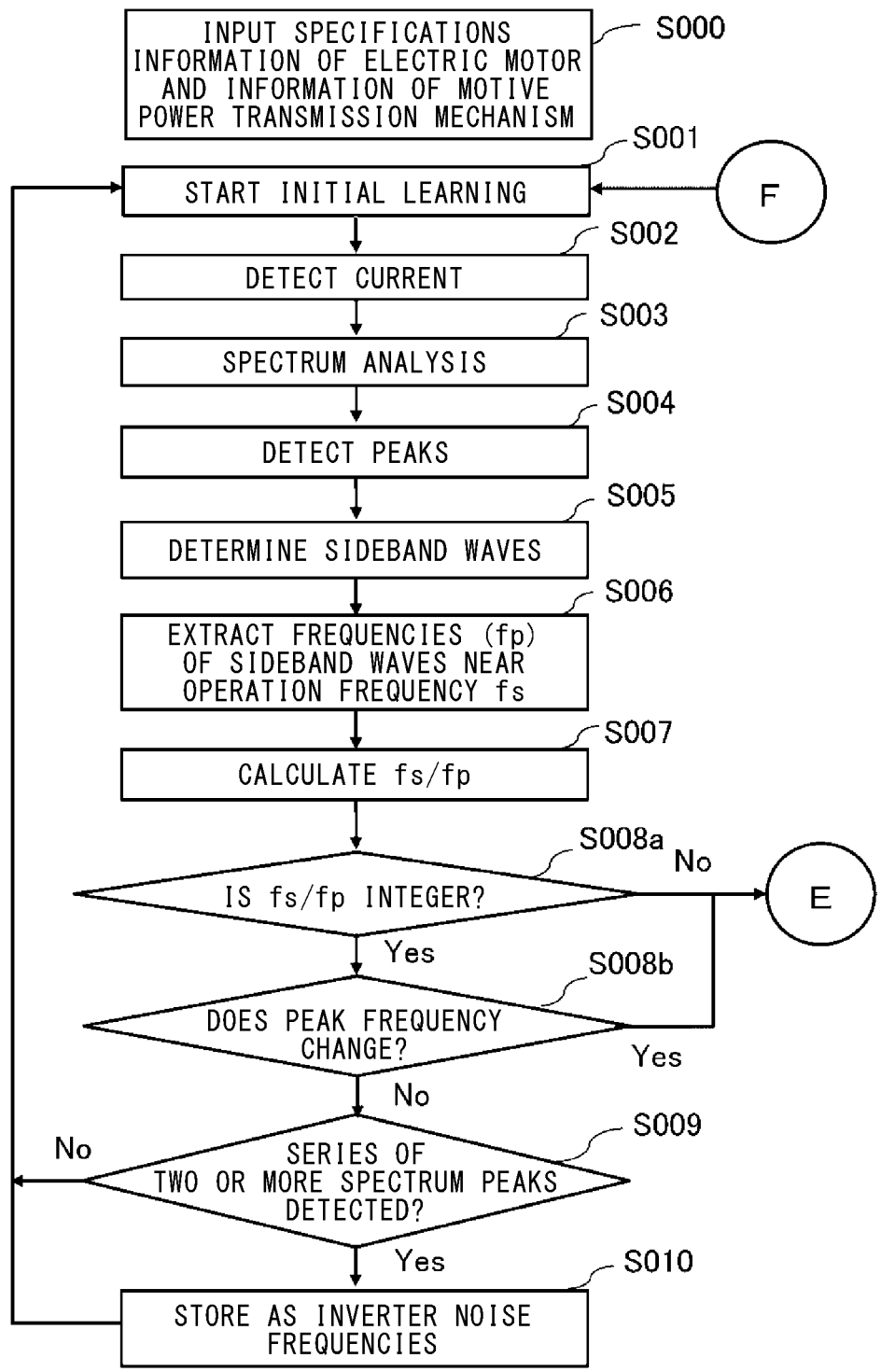
FIG. 15A is a flowchart showing the entire procedure for performing abnormality diagnosis using an abnormality diagnosis device according to embodiment 3.
Figure 15B:
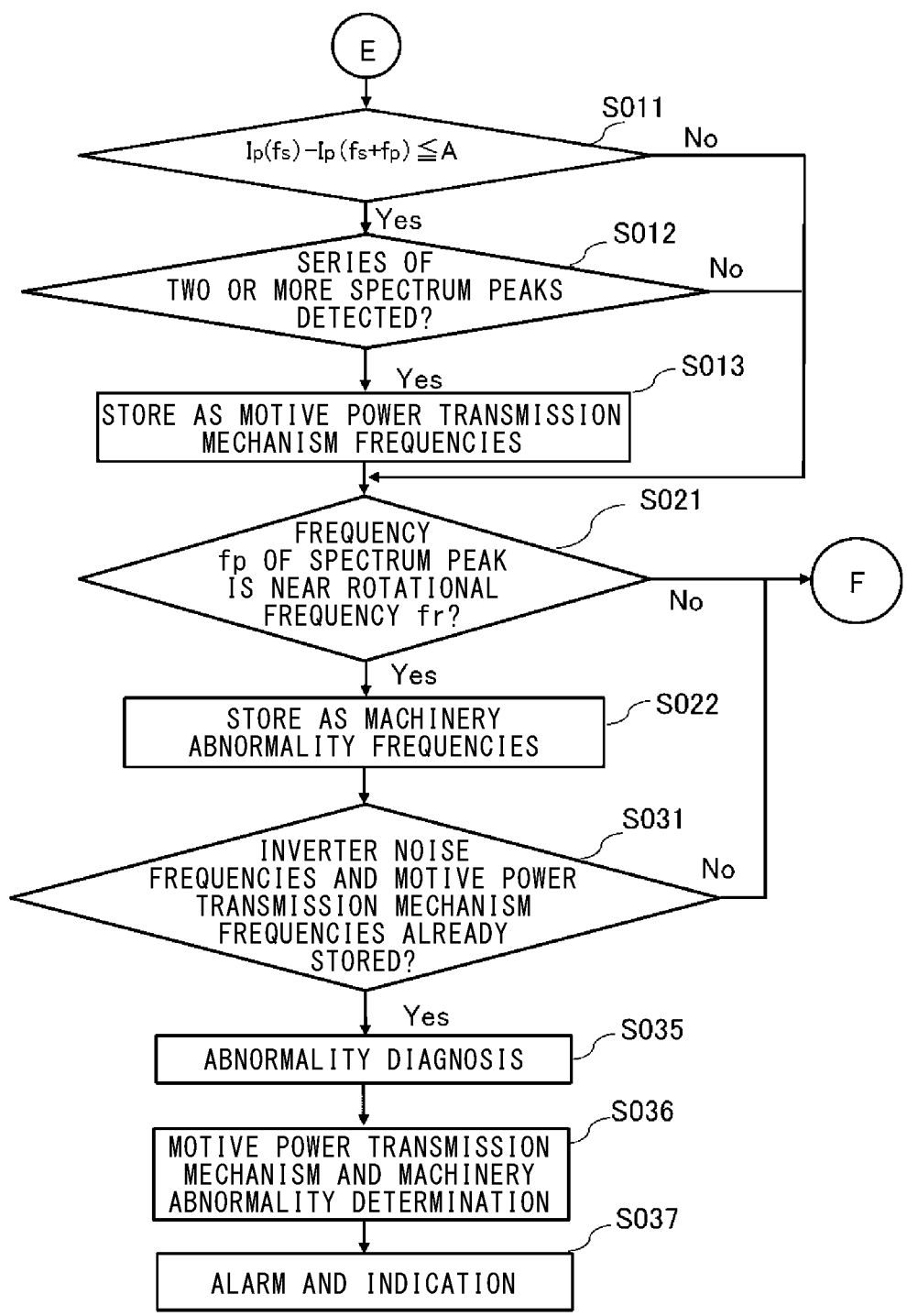
FIG. 15B is a flowchart showing the entire procedure for performing abnormality diagnosis using the abnormality diagnosis device according to embodiment 3.

FIG. 15A and FIG. 15B are flowcharts showing the procedure for diagnosing abnormality using the abnormality diagnosis device according to embodiment 3.

<Abnormality Diagnosis Procedure 1: Initial Learning>

First, the procedure of initial learning will be described.

In step S000, specifications information of the electric motor and information of the motive power transmission mechanism are inputted to the electric motor setting unit 21.

Steps S001 to S010 in FIG. 15A are the same as those in embodiment 2.

Among sideband waves, if it is determined that the value of $f_s/f_p$ is not an integer in step S008a, and if it is determined that the frequency changes depending on presence/absence of a load between a no-load operation state and a rated-load operation state of the electric motor in step S008b, the process proceeds to step S011.

In step S011, if $I_p(f_s)-I_p(f_s \pm f_p) \leq A$ is satisfied (Yes in step S011), the process proceeds to step S012, to determine whether or not a series of two or more spectrum peaks is detected.

In step S012, if it is determined that a series of two or more spectrum peaks is detected (Yes in step S012), the process proceeds to step S013, in which the frequency and the like of the spectrum peak having the frequency $f_b$ are stored as a motive power transmission mechanism frequency in the motive power transmission mechanism frequency storage unit 23e.

If $I_p(f_s)-I_p(f_s \pm f_p) > A$ is satisfied in step S011 (No in step S011) and if it is determined that a series of two or more spectrum peaks is not detected in step S012 (No in step S012), the spectrum peak is not determined as a motive power transmission mechanism frequency, and the process proceeds to step S021.

In step S021, the machinery abnormality frequency determination unit 25f determines whether or not the spectrum peak is near the rotational frequency $f_r$ of the electric motor 15. If it is determined that the spectrum peak is near the rotational frequency $f_r$ of the electric motor 15 (Yes in step S021), the frequency of the spectrum is stored as a machinery abnormality frequency in the machinery abnormality frequency storage unit 23f (step S022).

Next, in step S031, if it is determined that inverter noise frequencies have already been stored in the inverter noise frequency storage unit 23d and frequencies due to the motive power transmission mechanism have already been stored in the motive power transmission mechanism frequency storage unit 23e, the initial learning is finished because inverter noise frequencies, motive power transmission mechanism frequencies, and machinery abnormality frequencies have already been acquired.

In step S021, if it is not determined that the spectrum peak is near the rotational frequency $f_r$ of the electric motor 15 (No in step S021), the process returns to step S001 because machinery abnormality frequencies have not been acquired yet.

In addition, after machinery abnormality frequencies are acquired, in step S023, if inverter noise frequencies are not stored in the inverter noise frequency storage unit 23d or frequencies due to the motive power transmission mechanism are not stored in the motive power transmission mechanism frequency storage unit 23e (No in step S031), the process returns to step S001.

Next, abnormality diagnosis is started in step S035.

In step S036, whether or not there is abnormality in the motive power transmission mechanism and the machinery of the electric motor is determined. Here, current FFT analysis is performed as in the initial learning, and then spectrum peaks due to inverter noise, which have already been acquired in the initial learning, are extracted, and abnormality diagnosis is performed by referring thereto.

If it is determined that there is abnormality, the result is stored in the diagnosis result storage unit 28, and in step S037, alarm and indication are performed.

The details of the abnormality diagnosis are omitted. The abnormality diagnosis is performed through the abnormality diagnosis procedure described in embodiments 1 and 2.

As described above, according to embodiment 3, the same effects as in embodiments 1 and 2 are provided. That is, for the electric motor drive-controlled by the inverter, in initial learning, current flowing through the electric motor is detected, and if, among sideband waves extracted through FFT analysis of the detected current, sideband waves having such frequencies that $f_s/f_p$ is an integer with respect to the operation frequency $f_s$ of the electric motor control device do not change depending on presence/absence of a load and form a series of two or more spectrum peaks, the sideband waves are determined to be sideband waves due to inverter noise, and those frequencies and the like are stored. Thus, in abnormality diagnosis, spectrum peaks due to inverter noise can be extracted from the spectrum peaks extracted through current FFT analysis, whereby erroneous diagnosis due to inverter noise does not occur and diagnosis accuracy is improved.

In addition, in embodiment 3, spectrum peaks due to inverter noise of the electric motor control device 80, spectrum peaks due to the motive power transmission mechanism, and spectrum peaks due to machinery abnormality of the electric motor can be discriminated, whereby diagnosis accuracy is improved.

Embodiment 4

Hereinafter, an abnormality diagnosis device according to embodiment 4 will be described with reference to the drawings.

Figure 16:
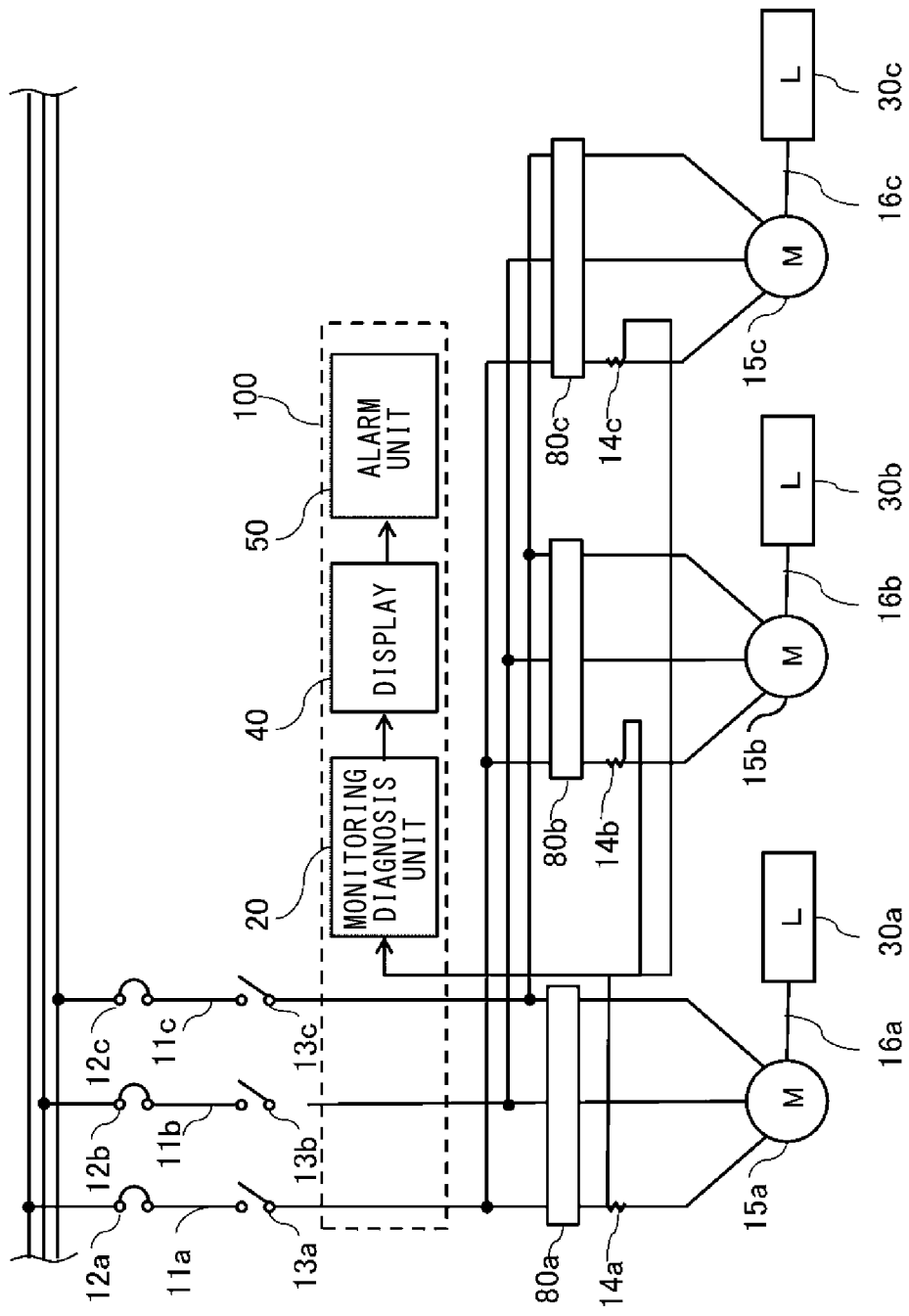
FIG. 16 illustrates the schematic configuration of an abnormality diagnosis device according to embodiment 4.

FIG. 16 illustrates the schematic configuration of the abnormality diagnosis device according to embodiment 4. In embodiments 1 to 3, one monitoring diagnosis unit 20, 20a is provided for one electric motor 15. However, in the present embodiment, a plurality of electric motors are monitored by one monitoring diagnosis unit.

In FIG. 16, a plurality of electric motors 15a, 15b, 15c are connected to power supply lines 11a, 11b, 11c for electric motor driving via electric motor control devices 80a, 80b, 80c, respectively, and current detectors 14a, 14b, 14c for detecting currents flowing through the respective electric motors 15a, 15b, 15c are each provided to at least one power supply line. In addition, circuit breakers 12a, 12b, 12c and electromagnetic contactors 13a, 13b, 13c are provided on the power supply lines 11a, 11b, 11c, respectively.

The monitoring diagnosis unit 20 stores, in advance, specifications information of the electric motors 15a, 15b, 15c and the electric motor control devices 80a, 80b, 80c, and specifications information of motive power transmission mechanisms 16a, 16b, 16c which transmit motive power from the electric motors 15a, 15b, 15c to the mechanical equipment 30a, 30b, 30c. Currents flowing through electric motors 15a, 15b, 15c and detected by the current detectors 14a, 14b, 14c are inputted to the monitoring diagnosis unit 20, which then performs current FFT analysis and initial learning. Thereafter, abnormality diagnosis is performed.

In the configuration in embodiment 4, for example, a plurality of motive power transmission mechanisms 16a, 16b, 16c can be collectively diagnosed by one abnormality diagnosis device 100. For example, in a case where the same type of electric motors and the same type of load equipment are used, comparison determination for spectrum waveforms can be performed. In the case where the same type of electric motors and the same type of load equipment are used, normally, similar waveforms are observed. Accordingly, spectrum waveforms based on the three current detectors 14a, 14b, 14c are compared to each other, whereby abnormality determination can be easily performed. In addition, when only a specific spectrum waveform exhibits abnormality, a symptom that will lead to abnormality can be inferred. For such comparison, a predetermined threshold may be set in advance.

As described above, according to embodiment 4, a plurality of electric motors are monitored by one monitoring diagnosis unit. Thus, in addition to the same effects in embodiments 1 to 3, it is possible to perform abnormality diagnosis by comparing spectrum waveforms obtained from a plurality of electric motors. In addition, the number of monitoring diagnosis devices decreases, whereby space saving can be achieved.

Although three electric motors are provided as an example, the number of electric motors is not limited to three.

Embodiment 5

Hereinafter, an abnormality diagnosis device according to embodiment 5 will be described with reference to the drawings.

Figure 17:
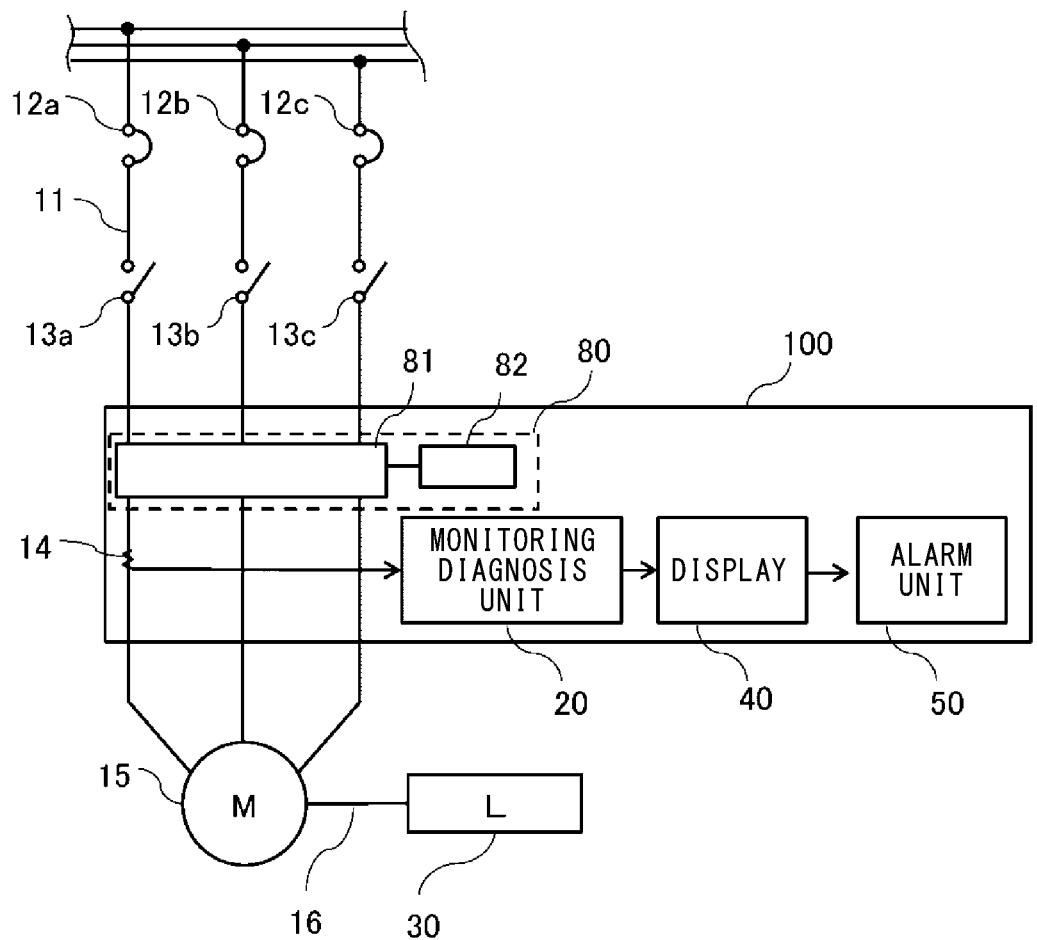
FIG. 17 illustrates the schematic configuration of an abnormality diagnosis device according to embodiment 5.

FIG. 17 illustrates the schematic configuration of the abnormality diagnosis device according to embodiment 5. In embodiments 1 to 4, the abnormality diagnosis device and the electric motor control device are configured independently of each other. However, as shown in FIG. 17, the electric motor control device 80 may be provided in the abnormality diagnosis device 100.

Thus, by configuring the abnormality diagnosis device and the electric motor control device integrally, it becomes unnecessary to ensure respective spaces for the electric motor control device and the abnormality diagnosis device individually.

As described above, according to embodiment 5, the same effects as in embodiments 1 to 3 are provided, and in addition, the abnormality diagnosis device and the electric motor control device are configured integrally, thus contributing to arrangement space saving.

Although the electric motor control device is provided in the abnormality diagnosis device as an example, the monitoring diagnosis unit, the display, and the alarm unit may be provided to the electric motor control device, so as to form an electric motor control device having an abnormality diagnosis function.

In the above embodiments 1 to 5, the operation frequency of the electric motor control device 80 when the spectrum peak is acquired and the signal intensity of the spectrum peak for the operation frequency are also stored in the same manner in the inverter noise frequency storage unit 23d, the motive power transmission mechanism frequency storage unit 23e, and the machinery abnormality frequency storage unit 23f. This is because the frequency due to inverter noise, the frequency due to the motive power transmission mechanism, and the frequency due to machinery abnormality of the electric motor change depending on the operation frequency of the electric motor control device 80. The operation frequency of the electric motor control device 80 when the spectrum peak is acquired and the signal intensity of the spectrum peak for the operation frequency are stored as a set, and learned data corresponding to the operation frequency of the electric motor control device 80 is used for diagnosis, whereby the possibility of erroneous diagnosis is eliminated.

Figure 18:
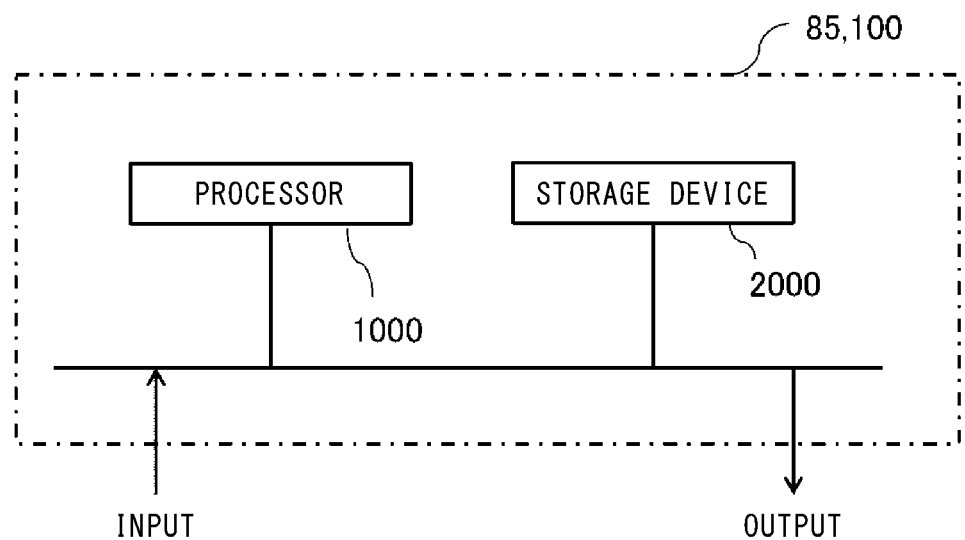
FIG. 18 is a hardware configuration diagram of the abnormality diagnosis device according to any of embodiments 1 to 5.

In the above embodiments 1 to 5, the abnormality diagnosis device 100 is composed of a processor 1000 and a storage device 2000 as shown in FIG. 18 which shows an example of hardware. Although not shown, the storage device is provided with a volatile storage device such as a random access memory and a nonvolatile auxiliary storage device such as a flash memory. Instead of the flash memory, an auxiliary storage device of a hard disk may be provided. The processor 1000 executes a program inputted from the storage device 2000. In this case, the program is inputted from the auxiliary storage device to the processor 1000 via the volatile storage device. The processor 1000 may output data such as a calculation result to the volatile storage device of the storage device 2000 or may store such data into the auxiliary storage device via the volatile storage device.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 11, 11a, 11b, 11c power supply line
12a, 12b, 12c circuit breaker
13a, 13b, 13c electromagnetic contactor
14, 14a, 14b, 14c current detector
15, 15a, 15b, 15c electric motor
16, 16a, 16b, 16c, 17 motive power transmission mechanism
20, 20a, 20b monitoring diagnosis unit
21 electric motor setting unit
22 memory unit
23 storage unit
23a determination reference storage unit
23d inverter noise frequency storage unit
23e motive power transmission mechanism frequency storage unit
23f machinery abnormality frequency storage unit calculation unit
25a spectrum analysis unit
25b sideband wave analysis unit
25c peak analysis unit
25d inverter noise frequency determination unit
25e motive power transmission mechanism frequency determination unit
25f machinery abnormality frequency determination unit
25g frequency correction unit
27 abnormality determination unit
28 diagnosis result storage unit
30, 30a, 30b, 30c mechanical equipment
40 display
50 alarm unit
80, 80a, 80b, 80c electric motor control device
81 inverter
82 control unit
100 abnormality diagnosis device
161 belt
1000 processor
2000 storage device

The invention claimed is:

1. An abnormality diagnosis device which performs determination for at least one of abnormality of an electric motor driven by power converted by an electric motor control device and abnormality of a motive power transmission mechanism which transmits motive power from the electric motor to a load, the electric motor control device including an inverter, the abnormality diagnosis device comprising:
   a current detection circuit to detect current of the electric motor; and
   a monitoring diagnoser to perform abnormality determination using spectrum peaks extracted by performing FFT analysis of current detected by the current detection circuit, wherein
   the monitoring diagnoser includes
      a peak analyzer to perform analysis using an operation frequency of the electric motor control device for driving the inverter and frequencies of sideband waves with respect to the operation frequency, and estimates whether or not the extracted spectrum peak is due to noise of the inverter,
      an inverter noise frequency determiner to determine a frequency of the spectrum peak due to noise of the inverter on the basis of the spectrum peak estimated to be due to noise of the inverter by the peak analyzer,
      an inverter noise frequency storage to store in advance the frequency of the spectrum peak due to noise of the inverter determined by the inverter noise frequency determiner, and
      an abnormality determiner, and
   the abnormality determiner performs abnormality determination, after extracting the spectrum peak due to noise of the inverter, from the spectrum peaks extracted through FFT analysis of the current detected by the current detection circuit.

2. The abnormality diagnosis device according to claim 1, wherein
   the monitoring diagnoser further includes a motive power transmission mechanism frequency determiner and a motive power transmission mechanism frequency storage, in a case where a value obtained by dividing the operation frequency of the electric motor control device by the frequency of the sideband wave with respect to the operation frequency is an integer, the peak analyzer estimates the extracted spectrum peak to be a first spectrum peak due to noise of the inverter, in a case where the first spectrum peaks estimated to be due to noise of the inverter by the peak analysis unit form a series of two or more spectrum peaks at the frequencies of the sideband waves, the inverter noise frequency determiner determines the first spectrum peaks to be the spectrum peaks due to noise of the inverter and determines the frequencies of the spectrum peaks due to noise of the inverter, regarding a second spectrum peak for which a value obtained by the peak analyzer dividing the operation frequency of the electric motor control device by the frequency of the sideband wave with respect to the operation frequency is not an integer, in a case where a difference between a signal intensity of the second spectrum peak and a signal intensity of the spectrum peak for the operation frequency is a predetermined threshold or less and the second spectrum peaks form a series of two or more spectrum peaks at the frequencies of the sideband waves thereof, the motive power transmission mechanism frequency determiner determines the second spectrum peaks to be spectrum peaks due to the motive power transmission mechanism and determines frequencies of the spectrum peaks due to the motive power transmission mechanism, the motive power transmission mechanism frequency storage stores in advance the frequencies of the spectrum peaks due to the motive power transmission mechanism determined by the motive power transmission mechanism frequency determiner, and the abnormality determiner performs abnormality determination using the frequencies of the spectrum peaks due to the motive power transmission mechanism stored in the motive power transmission mechanism frequency storage, after extracting the spectrum peaks due to noise of the inverter on the basis of the frequencies of the sideband waves due to noise of the inverter stored in the inverter noise frequency storage, from the spectrum peaks extracted through FFT analysis of the current detected by the current detection circuit.

3. The abnormality diagnosis device according to claim 1, wherein the monitoring diagnoser further includes a motive power transmission mechanism frequency determination unit, a motive power transmission mechanism frequency storage, and a frequency corrector, in a case where a value obtained by dividing the operation frequency of the electric motor control device by the frequency of the sideband wave with respect to the operation frequency is an integer, the peak analyzer estimates the extracted spectrum peak to be a first spectrum peak due to noise of the inverter, in a case where the first spectrum peaks estimated to be due to noise of the inverter by the peak analyzer form a series of two or more spectrum peaks at the frequencies of the sideband waves, the inverter noise frequency determiner determines the first spectrum peaks to be the spectrum peaks due to noise of the inverter and determines the frequencies of the spectrum peaks due to noise of the inverter, regarding a second spectrum peak for which a value obtained by the peak analyzer dividing the operation frequency of the electric motor control device by the frequency of the sideband wave with respect to the operation frequency is not an integer, in a case where a difference between a signal intensity of the second spectrum peak and a signal intensity of the spectrum peak for the operation frequency is a predetermined threshold or less and the second spectrum peaks form a series of two or more spectrum peaks at the frequencies of the sideband waves thereof, the motive power transmission mechanism frequency determiner determines the second spectrum peaks to be spectrum peaks due to the motive power transmission mechanism and determines frequencies of the spectrum peaks due to the motive power transmission mechanism, the motive power transmission mechanism frequency storage stores in advance the frequencies of the spectrum peaks due to the motive power transmission mechanism determined by the motive power transmission mechanism frequency determiner, the abnormality determiner determines, as a diagnosis-time operation frequency of the electric motor control device, a frequency of a spectrum peak having a greatest signal intensity among the spectrum peaks extracted through FFT analysis of the current detected by the current detection circuit, and in a case where frequencies of spectrum peaks due to noise of the inverter and frequencies of spectrum peaks due to the motive power transmission mechanism that correspond to the diagnosis-time operation frequency, are not respectively stored in the inverter noise frequency storage and the motive power transmission mechanism frequency storage, the frequency corrector corrects the operation frequency to the diagnosis-time operation frequency, and estimates frequencies of spectrum peaks due to the motive power transmission mechanism on the basis of the diagnosis-time operation frequency, for the frequencies of the spectrum peaks due to the motive power transmission mechanism stored in the motive power transmission mechanism frequency storage, and the abnormality determiner performs abnormality determination using the frequencies of the spectrum peaks due to the motive power transmission mechanism estimated on the basis of the diagnosis-time operation frequency in the frequency corrector and spectrum peaks due to noise of the inverter determined from the corrected operation frequency.

4. The abnormality diagnosis device according to claim 1, wherein the monitoring diagnoser further includes a machinery abnormality frequency determiner and a machinery abnormality frequency storage for the electric motor, the peak analyzer estimates, as being due to noise of the inverter, a third spectrum peak for which a value obtained by dividing the operation frequency of the electric motor control device by the frequency of the sideband wave with respect to the operation frequency is an integer and the frequency of the sideband wave with respect to the operation frequency does not change depending on whether the electric motor is operating with or without the load, in a case where the third spectrum peaks estimated to be due to noise of the inverter by the peak analyzer form a series of two or more spectrum peaks at the frequencies of the sideband waves of the third spectrum peaks, the inverter noise frequency determiner determines the third spectrum peaks to be the spectrum peaks due to noise of the inverter and determines the frequencies of the spectrum peaks due to noise of the inverter, regarding a second spectrum peak for which a value obtained by the peak analyzer dividing the operation frequency of the electric motor control device by the frequency of the sideband wave with respect to the operation frequency is not an integer, and a fourth spectrum peak for which a value obtained by dividing the operation frequency of the electric motor control device by the frequency of the sideband wave with respect to the operation frequency is an integer and the frequency of the sideband wave with respect to the operation frequency changes depending on whether the electric motor is operating with or without the load, the machinery abnormality frequency determiner compares a difference between the frequency of each second/fourth spectrum peak and a rotational frequency of the electric motor, and if the difference is a predetermined threshold or less, the machinery abnormality frequency determiner determines the second/fourth spectrum peaks to be spectrum peaks due to machinery abnormality of the electric motor and determines frequencies of the spectrum peaks due to machinery abnormality of the electric motor, the machinery abnormality frequency storage stores in advance the frequencies of the spectrum peaks due to machinery abnormality of the electric motor determined by the machinery abnormality frequency determiner, and the abnormality determiner performs abnormality determination using the frequencies of the spectrum peaks due to machinery abnormality of the electric motor stored in the machinery abnormality frequency storage, after extracting the spectrum peaks due to noise of the inverter on the basis of the frequencies of the sideband waves due to noise of the inverter stored in the inverter noise frequency storage, from the spectrum peaks extracted through FFT analysis of the current detected by the current detection circuit.

5. The abnormality diagnosis device according to claim 1, wherein the monitoring diagnoser further includes a motive power transmission mechanism frequency determiner, a motive power transmission mechanism frequency storage, a machinery abnormality frequency determiner for the electric motor, and a machinery abnormality frequency storage for the electric motor, the peak analyzer estimates, as being due to noise of the inverter, a third spectrum peak for which a value obtained by dividing the operation frequency of the electric motor control device by the frequency of the sideband wave with respect to the operation frequency is an integer and the frequency of the sideband wave with respect to the operation frequency does not change depending on whether the electric motor is operating with or without the load, in a case where the third spectrum peaks estimated to be due to noise of the inverter by the peak analyzer form a series of two or more spectrum peaks at the frequencies of the sideband waves of the third spectrum peaks, the inverter noise frequency determiner determines the third spectrum peaks to be the spectrum peaks due to noise of the inverter and determines the frequencies of the spectrum peaks due to noise of the inverter, regarding a second spectrum peak for which a value obtained by the peak analyzer dividing the operation frequency of the electric motor control device by the frequency of the sideband wave with respect to the operation frequency is not an integer, and a fourth spectrum peak for which a value obtained by dividing the operation frequency of the electric motor control device by the frequency of the sideband wave with respect to the operation frequency is an integer and the frequency of the sideband wave with respect to the operation frequency changes depending on whether the electric motor is operating with or without the load, the motive power transmission mechanism frequency determiner compares a difference between a signal intensity of each second/fourth spectrum peak and a signal intensity of the spectrum peak for the operation frequency, and if fifth spectrum peaks for which the difference is a predetermined threshold or less form a series of two or more spectrum peaks at the frequencies of the sideband waves thereof, determines the fifth spectrum peaks to be spectrum peaks due to the motive power transmission mechanism and determines frequencies of the spectrum peaks due to the motive power transmission mechanism, the motive power transmission mechanism frequency storage stores in advance the frequencies of the spectrum peaks due to the motive power transmission mechanism determined by the motive power transmission mechanism frequency determiner, while the motive power transmission mechanism frequency determiner compares the difference between the signal intensity of each second/fourth spectrum peak and the signal intensity of the spectrum peak for the operation frequency, regarding a sixth spectrum peak for which the difference is greater than the predetermined threshold and a seventh spectrum peak not determined to be the spectrum peak due to the motive power transmission mechanism among the fifth spectrum peaks, the machinery abnormality frequency determiner compares a difference between a frequency of each sixth/seventh spectrum peak and a rotational frequency of the electric motor, and if the difference is a predetermined threshold or less, the machinery abnormality frequency determiner determines the sixth/seventh spectrum peaks to be spectrum peaks due to machinery abnormality of the electric motor and determines frequencies of the spectrum peaks due to machinery abnormality of the electric motor, the machinery abnormality frequency storage stores in advance the frequencies of the spectrum peaks due to machinery abnormality of the electric motor determined by the machinery abnormality frequency determiner, and the abnormality determiner performs abnormality determination using the frequencies of the spectrum peaks due to the motive power transmission mechanism stored in the motive power transmission mechanism frequency storage and the frequencies of the spectrum peaks due to machinery abnormality of the electric motor stored in the machinery abnormality frequency storage, after extracting the spectrum peaks due to noise of the inverter on the basis of the frequencies of the sideband waves due to noise of the inverter stored in the inverter noise frequency storage, from the spectrum peaks extracted through FFT analysis of the current detected by the current detection circuit.

6. The abnormality diagnosis device according to claim 1, wherein the motive power transmission mechanism includes one of a belt, a speed reduction device, and a chain.

7. The abnormality diagnosis device according to claim 1, wherein
the current detection circuits are respectively provided for a plurality of the electric motors driven by the individual electric motor control devices, and
abnormality determination is performed for the plurality of electric motors.

8. The abnormality diagnosis device according to claim 1, wherein
the electric motor control device is provided in the abnormality diagnosis device.

9. An abnormality diagnosis method for performing determination for at least one of abnormality of an electric motor driven by power converted by an electric motor control device which has an inverter and drives the inverter, and abnormality of a motive power transmission mechanism which transmits motive power from the electric motor to a load, the abnormality diagnosis method comprising:
a learning step including
detecting current of the electric motor,
performing FFT analysis of the detected current and detecting spectrum peaks,
extracting frequencies of sideband waves with respect to an operation frequency of the electric motor control device for driving the inverter, from the detected spectrum peaks,
estimating whether or not the spectrum peak is a spectrum peak due to noise of the inverter, using the operation frequency and the extracted frequencies of the sideband waves, and
determining a frequency of the spectrum peak due to noise of the inverter on the basis of the spectrum peak estimated to be the spectrum peak due to noise of the inverter, and storing the frequency; and
an abnormality diagnosis step including
detecting current of the electric motor,
performing FFT analysis of the detected current and detecting spectrum peaks,
extracting the frequency of the spectrum peak due to noise of the inverter, from the detected spectrum peaks, and
performing abnormality diagnosis.

10. The abnormality diagnosis method according to claim 9, wherein
the learning step includes
in a case where a value obtained by dividing the operation frequency of the electric motor control device by the frequency of the sideband wave with respect to the operation frequency is an integer, estimating the extracted spectrum peak to be a first spectrum peak due to noise of the inverter,
regarding a second spectrum peak for which a value obtained by dividing the operation frequency of the electric motor control device by the frequency of the sideband wave with respect to the operation frequency is not an integer, in a case where a difference between a signal intensity of the second spectrum peak and a signal intensity of the spectrum peak for the operation frequency is a predetermined threshold or less and the second spectrum peaks form a series of two or more spectrum peaks at the frequencies of the sideband waves of the second spectrum peaks, determining the second spectrum peaks to be spectrum peaks due to the motive power transmission mechanism and storing frequencies of the spectrum peaks due to the motive power transmission mechanism, and
in a case where the first spectrum peaks form a series of two or more spectrum peaks at the frequencies of the sideband waves, the first spectrum peaks are determined to be the spectrum peaks due to noise of the inverter and the frequencies of the spectrum peaks due to noise of the inverter are determined and stored, and
the abnormality diagnosis step includes performing abnormality determination using the frequencies of the spectrum peaks due to the motive power transmission mechanism.

11. The abnormality diagnosis method according to claim 9, wherein
the learning step includes
in a case where a value obtained by dividing the operation frequency of the electric motor control device by the frequency of the sideband wave with respect to the operation frequency is an integer, estimating the extracted spectrum peak to be a first spectrum peak due to noise of the inverter,
regarding a second spectrum peak for which a value obtained by dividing the operation frequency of the electric motor control device by the frequency of the sideband wave with respect to the operation frequency is not an integer, in a case where a difference between a signal intensity of the second spectrum peak and a signal intensity of the spectrum peak for the operation frequency is a predetermined threshold or less and the second spectrum peaks form a series of two or more spectrum peaks at the frequencies of the sideband waves of the second spectrum peaks, determining the second spectrum peaks to be spectrum peaks due to the motive power transmission mechanism and storing frequencies of the spectrum peaks due to the motive power transmission mechanism, and
in a case where the first spectrum peaks form a series of two or more spectrum peaks at the frequencies of the sideband waves, the first spectrum peaks are determined to be the spectrum peaks due to noise of the inverter and the frequencies of the spectrum peaks due to noise of the inverter are determined and stored,
the abnormality diagnosis step includes
determining, as a diagnosis-time operation frequency of the electric motor control device, a frequency of a spectrum peak having a greatest signal intensity among the detected spectrum peaks,
in a case where frequencies of spectrum peaks due to noise of the inverter and frequencies of spectrum peaks due to the motive power transmission mechanism that correspond to the diagnosis-time operation frequency are not respectively stored in the learning step, correcting the operation frequency to the diagnosis-time operation frequency, and estimating frequencies of spectrum peaks due to the motive power transmission mechanism on the basis of the diagnosis-time operation frequency,
determining frequencies of spectrum peaks due to noise of the inverter using the diagnosis-time operation frequency, and
extracting the frequencies of the spectrum peaks due to noise of the inverter determined using the diagnosis-time operation frequency, from the spectrum peaks detected in the seventh step, and the abnormality diagnosis includes a step of performing abnormality determination.

12. The abnormality diagnosis method according to claim 9, wherein
the learning step includes
estimating, as being due to noise of the inverter, a third spectrum peak for which a value obtained by dividing the operation frequency of the electric motor control device by the frequency of the sideband wave with respect to the operation frequency is an integer and the frequency of the sideband wave with respect to the operation frequency does not change depending on whether the electric motor is operating with or without the load,
regarding a second spectrum peak for which a value obtained by dividing the operation frequency of the electric motor control device by the frequency of the sideband wave with respect to the operation frequency is not an integer, and a fourth spectrum peak for which a value obtained by dividing the operation frequency of the electric motor control device by the frequency of the sideband wave with respect to the operation frequency is an integer and the frequency of the sideband wave with respect to the operation frequency changes depending on whether the electric motor is operating with or without the load, comparing a difference between the frequency of each second/fourth spectrum peak and a rotational frequency of the electric motor, and if the difference is a predetermined threshold or less, determining the second/fourth spectrum peaks to be spectrum peaks due to machinery abnormality of the electric motor and storing frequencies of the spectrum peaks due to machinery abnormality of the electric motor, and
in a case where the third spectrum peaks form a series of two or more spectrum peaks at the frequencies of the sideband waves, the third spectrum peaks are determined to be the spectrum peaks due to noise of the inverter and the frequencies of the spectrum peaks due to noise of the inverter are determined and stored, and
the abnormality diagnosis step includes performing abnormality determination using the frequencies of the spectrum peaks due to machinery abnormality of the electric motor.

13. The abnormality diagnosis method according to claim 9, wherein
the learning step includes
estimating, as being due to noise of the inverter, a third spectrum peak for which a value obtained by dividing the operation frequency of the electric motor control device by the frequency of the sideband wave with respect to the operation frequency is an integer and the frequency of the sideband wave with respect to the operation frequency does not change depending on whether the electric motor is operating with or without the load,
regarding a second spectrum peak for which a value obtained by dividing the operation frequency of the electric motor control device by the frequency of the sideband wave with respect to the operation frequency is not an integer, and a fourth spectrum peak for which a value obtained by dividing the operation frequency of the electric motor control device by the frequency of the sideband wave with respect to the operation frequency is an integer and the frequency of the sideband wave with respect to the operation frequency changes depending on whether the electric motor is operating with or without the load, comparing a signal intensity for the frequency of each second/fourth spectrum peak and a signal intensity of the spectrum peak for the operation frequency, defining, as a fifth spectrum peak, the second/fourth spectrum peak for which a comparison difference is a predetermined threshold or less, and if the fifth spectrum peaks form a series of two or more spectrum peaks at the frequencies of the sideband waves of the fifth spectrum peaks, determining the fifth spectrum peaks to be spectrum peaks due to the motive power transmission mechanism and storing frequencies of the spectrum peaks due to the motive power transmission mechanism,
comparing the difference between the signal intensity of each second/fourth spectrum peak and the signal intensity of the spectrum peak for the operation frequency, and then, regarding a sixth spectrum peak for which the difference is greater than the predetermined threshold and a seventh spectrum peak not determined to be the spectrum peak due to the motive power transmission mechanism among the fifth spectrum peaks, comparing a difference between a frequency of each sixth/seventh spectrum peak and a rotational frequency of the electric motor, and if the difference is a predetermined threshold or less, determining the sixth/seventh spectrum peaks to be spectrum peaks due to machinery abnormality of the electric motor and storing frequencies of the spectrum peaks due to machinery abnormality of the electric motor, and
in a case where the third spectrum peaks form a series of two or more spectrum peaks at the frequencies of the sideband waves, the third spectrum peaks are determined to be the spectrum peaks due to noise of the inverter and the frequencies of the spectrum peaks due to noise of the inverter are determined and stored, and
the abnormality diagnosis step includes performing abnormality determination using the frequencies of the spectrum peaks due to the motive power transmission mechanism and the frequencies of the spectrum peaks due to machinery abnormality of the electric motor.

\* \* \* \* \*